(12) United States Patent
Kouno

(10) Patent No.: US 8,299,539 B2
(45) Date of Patent: Oct. 30, 2012

(54) SEMICONDUCTOR DEVICE HAVING IGBT AND FWD ON SAME SUBSTRATE

(75) Inventor: Kenji Kouno, Gifu (JP)

(73) Assignee: Denso Corporation, Kariya (JP)

( * ) Notice: Subject to any disclaimer, the term of this patent is extended or adjusted under 35 U.S.C. 154(b) by 455 days.

(21) Appl. No.: 12/588,310

(22) Filed: Oct. 13, 2009

(65) Prior Publication Data

US 2010/0090248 A1   Apr. 15, 2010

(30) Foreign Application Priority Data

Oct. 14, 2008 (JP) ................................. 2008-265593
Jul. 8, 2009 (JP) ................................. 2009-162041

(51) Int. Cl.
   *H01L 27/06* (2006.01)

(52) U.S. Cl. ........ 257/370; 257/133; 257/140; 257/565; 257/E27.017; 257/E29.027; 257/E29.066; 257/E29.197

(58) Field of Classification Search .................. 257/140, 257/565, 133, 370, E29.027, E29.066, E29.197, 257/E27.017
See application file for complete search history.

(56) References Cited

U.S. PATENT DOCUMENTS

| | | | |
|---|---|---|---|
| 5,619,047 A | 4/1997 | Bauer | |
| 6,069,371 A | 5/2000 | Omura et al. | |
| 2001/0026977 A1 | 10/2001 | Hattori et al. | |
| 2003/0089966 A1 | 5/2003 | Hattori et al. | |
| 2004/0021174 A1 | 2/2004 | Kobayashi | |
| 2004/0041171 A1 | 3/2004 | Ogura et al. | |
| 2004/0089886 A1 | 5/2004 | Hattori et al. | |
| 2005/0045960 A1 | 3/2005 | Takahashi | |
| 2005/0062064 A1 | 3/2005 | Hattori et al. | |
| 2005/0179083 A1 | 8/2005 | Ogura et al. | |
| 2005/0258493 A1 | 11/2005 | Aono et al. | |
| 2006/0055056 A1 | 3/2006 | Miura et al. | |
| 2007/0069287 A1 | 3/2007 | Takahashi | |
| 2007/0108468 A1 | 5/2007 | Takahashi | |
| 2007/0170549 A1 | 7/2007 | Tsuzuki et al. | |
| 2007/0278566 A1 | 12/2007 | Ogura et al. | |
| 2008/0048295 A1 | 2/2008 | Takahashi | |
| 2009/0057832 A1 | 3/2009 | Kouno | |

FOREIGN PATENT DOCUMENTS

JP   A-04-48656   2/1992

(Continued)

OTHER PUBLICATIONS

Office Action dated Apr. 14, 2011 issued from the Chinese Patent Office in the corresponding Chinese Patent Application No. 2009-10204074.6 (and English translation).

(Continued)

*Primary Examiner* — N Drew Richards
*Assistant Examiner* — Yu-Hsi D Sun
(74) *Attorney, Agent, or Firm* — Posz Law Group, PLC

(57) ABSTRACT

A semiconductor device includes: a semiconductor substrate; an IGBT element including a collector region; a FWD element including a cathode region adjacent to the collector region; a base layer on the substrate; multiple trench gate structures including a gate electrode. The base layer is divided by the trench gate structures into multiple first and second regions. Each first region includes an emitter region contacting the gate electrode. Each first region together with the emitter region is electrically coupled with an emitter electrode. The first regions include collector side and cathode side first regions, and the second regions include collector side and cathode side second regions. At least a part of the cathode side second region is electrically coupled with the emitter electrode, and at least a part of the collector side second region has a floating potential.

16 Claims, 17 Drawing Sheets

FOREIGN PATENT DOCUMENTS

| | | |
|---|---|---|
| JP | A-11-097715 | 4/1999 |
| JP | A-2004-88001 | 3/2004 |
| JP | A-2005-268495 | 9/2005 |
| JP | A-2007-258363 | 10/2007 |
| JP | A-2008-072848 | 3/2008 |
| JP | A-2008-300528 | 12/2008 |
| JP | A-2008-300529 | 12/2008 |

OTHER PUBLICATIONS

Office Action dated Nov. 24, 2010 from Japanese Patent Office in corresponding JP Patent Application No. 2009-162041 (and English Translation).

R. Natarajan, et al. "An 800V Integrated DMOS-IGBT/PiN or MPS-Rectifier Power Device," *Proceddings of 2004 International Symposium on Power Semiconductor Devices & ICs*, Kitakyushu, pp. 261-264 (discussed on p. 2 of the specification).

SEMICONDUCTOR DEVICE HAVING IGBT AND FWD ON SAME SUBSTRATE

CROSS REFERENCE TO RELATED APPLICATIONS

This application is based on Japanese Patent Applications No. 2008-265593 filed on Oct. 14, 2008, and No. 2009-162041 filed on Jul. 8, 2009, the disclosures of which are incorporated herein by reference.

FIELD OF THE INVENTION

The present invention relates to a semiconductor device having an IGBT and a FWD, which are arranged on the same semiconductor substrate.

BACKGROUND OF THE INVENTION

Conventionally, for example as disclosed in JP-2005-317751 corresponding to US 2005/0258493, a reverse conduction type semiconductor device (i.e., RC-IGBT or reverse conducting IGBT) includes an IGBT (insulated gate bipolar transistor) and a FWD (free wheel diode), which are disposed in the same semiconductor substrate, so that the FWD is built in the IGBT.

In the RC-IGBT, an anode electrode of the FWD and an emitter electrode of the IGBT are common, and a cathode electrode of the FWD and a collector electrode of the IGBT are common. The RC-IGBT is mounted in an inverter circuit so that the RC-IGBT executes PWM control of a load.

However, when the RC-IGBT is assembled in the inverter circuit, a driving signal to be input into the gate electrode of the IGBT is, in general, a phase reversal signal in an up-down arm direction. Thus, even when the FWD performs a free wheel function, the driving signal is input into the gate electrode of the IGBT. Accordingly, the FWD and the IGBT function at the same time.

When the FWD and the IGBT function at the same time, i.e., when the gate of the IGBT turns on at the time when the FWD functions, the electric potential of the anode is equalized with the electric potential of the cathode of the FWD since the above electrodes are common. Thus, the FWD hardly performs a forward function. Thus, when the driving signal is input into the gate electrode of the IGBT, a forward voltage Vf of the FWD increases, and thereby, a DC loss of the semiconductor device becomes large.

To avoid the above difficulty, a region of the IGBT and a region of the FWD are separated from each other. This device structure is disclosed in, for example, Proceedings of 2004 International Symposium on Power Semiconductor Devices & Ics, on page 261-264. The gate electrode of the IGBT is not arranged in the region of the FWD, so that the FWD as a body diode is not built in the IGBT. However, the region of the FWD, which provides diode function, and does not provide IGBT function, becomes wide. Accordingly, when a chip size of the device is the same, the region of the IGBT becomes narrow. That is, an occupancy rate of the region of the IGBT in the chip is reduced since the FWD single purpose region is arranged in the chip. In this case, an on-state voltage Von of the IGBT increases, and the DC loss of the semiconductor device increases. Further, when the on-state voltage Von of the IGBT is fixed to be small, the dimensions of the chip become large.

SUMMARY OF THE INVENTION

In view of the above-described problem; it is an object of the present disclosure to provide a semiconductor device having an IGBT and a FWD, which are arranged on the same semiconductor substrate. In the device, a chip size of the device is improved, and a forward voltage of the FWD and an on-state voltage of the IGBT are improved.

According to an aspect of the present disclosure, a semiconductor device includes: a semiconductor substrate having a first conductive type and including a first side and a second side; an IGBT element for flowing current in a thickness direction of the substrate, wherein the IGBT element is arranged in the substrate, the IGBT includes a collector region having a second conductive type, and the collector region is arranged in a surface portion of the second side of the substrate; a FWD element including a cathode region having the first conductive type, wherein the cathode region is arranged in another surface portion of the second side of the substrate in such a manner that the cathode region is adjacent to the collector region along with a parallel direction of the substrate; a base layer having the second conductive type and arranged on the first side of the substrate; a plurality of trench gate structures, each of which includes a trench on the first side of the substrate and a conductive film in the trench via an insulation film. The base layer is divided by the trench gate structures into a plurality of first and second regions. The trench gate structures include a gate electrode in the IGBT element. Each first region includes an emitter region in the IGBT element. Each emitter region is arranged in a surface portion of the first region, contacts the gate electrode, has the first conductive type, and has an impurity concentration higher than the substrate. Each second region does not include the emitter region. Each first region together with the emitter region is electrically coupled with an emitter electrode in the IGBT. The first regions include a collector side first region and a cathode side first region. The collector side first region is disposed over the collector region, and the cathode side first region is disposed over the cathode region. The second regions include a collector side second region and a cathode side second region. The collector side second region is disposed over the collector region, and the cathode side second region is disposed over the cathode region. At least a part of the cathode side second region is electrically coupled with the emitter electrode. At least a part of the collector side second region has a floating potential.

In the above device, multiple first regions over the collector region and the cathode region function as a channel of the IGBT element and an anode of the FWD element. Thus, a part of the FWD element is built in the IGBT element. Thus, when the on-state voltage of the IGBT is set to be a predetermined voltage, dimensions of the device are reduced.

Further, the part of the cathode side second region is electrically coupled with the emitter electrode. Thus, the part of the cathode side second region together with the first regions function as an anode of the FWD element. Thus, the area for functioning the anode becomes large. Further, current path of the FWD is shortened. Furthermore, since the emitter region of the IGBT does not exist in the second region, even when the driving signal is input into the gate electrode, the second region and the substrate do not have the same potential. Thus, the second region is not affected by the influence of the gate electrode. Accordingly, the forward voltage of the FWD is reduced.

Further, since the part of the collector side second region has a floating potential, even when the driving signal is input into the gate electrode so that the channel is formed under the emitter region in the first region, holes are not retrieved to the emitter electrode via the second region. Therefore, the hole is accumulated in the substrate. Since the first regions are disposed not only over the cathode region but also over the collector region, the area of the IGBT element becomes large. Accordingly, the on-state voltage of the IGBT element is reduced.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
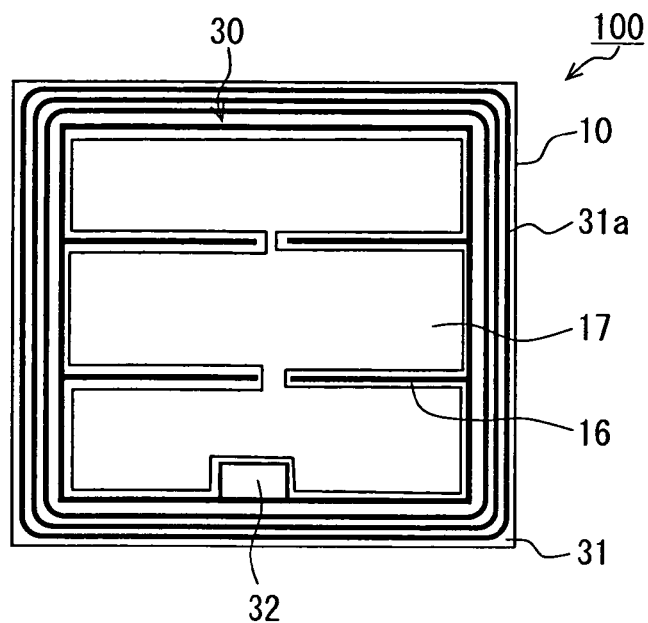
FIG. 1 is a diagram showing a plan view of a front side of a semiconductor device according to a first embodiment.
Figure 2:
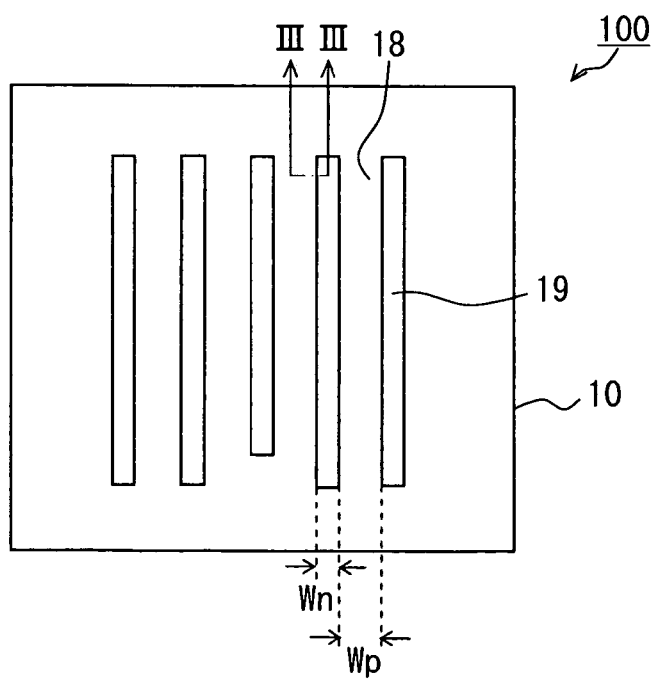
FIG. 2 is a diagram showing a plan view of a backside of the semiconductor device.
Figure 3:
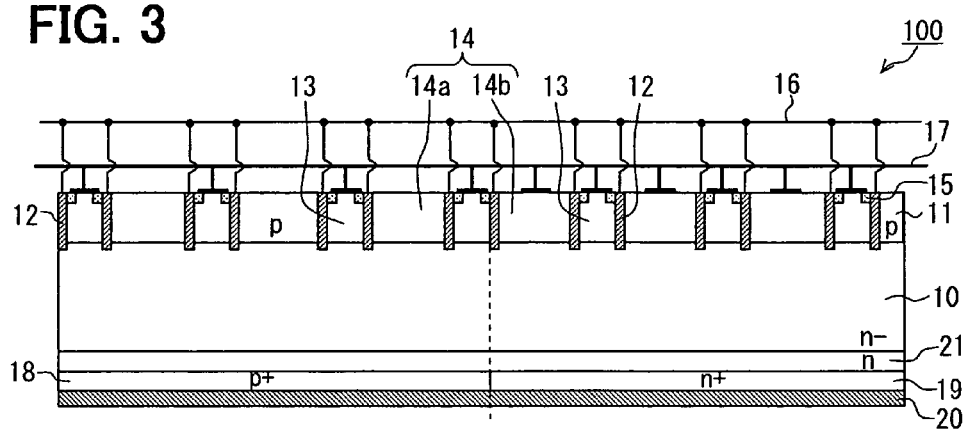
FIG. 3 is a diagram showing a cross sectional view of the device taken along line III-III in FIG. 2.

FIGS. 1-3 show a semiconductor device according to a first embodiment. In FIG. 2, a collector electrode of the device is not shown.

The semiconductor device is suitably used for a power switching device in an inverter module of an EHV (electric and hybrid vehicle). Here, a thickness direction of a semiconductor substrate is perpendicular to the substrate, and one direction perpendicular to the thickness direction is defined as a parallel direction of the substrate. The parallel direction is in parallel to a direction of arrangement of a collector region and a cathode region. A N conductive type is, for example, a first conductive type, and a P conductive type is a second conductive type. Alternatively, the first conductive type may be the P conductive type, and the second conductive type may be the N conductive type.

The device 100 in FIGS. 1-3 includes a semiconductor substrate 10 having the first conductive type. The substrate 10 includes a region 30, in which an IGBT and a FWD are formed. A guard ring 31a for functioning as a suppression portion of electric field concentration is arranged in a periphery region 31 of the substrate 10. The guard ring 31a surrounds the region 30. In FIG. 1, the guard ring 31a has a triplex structure. Alternatively, the guard ring 31a may have a single structure, double structure, quadplex or more structure. A gate pad 32 inputs a driving signal to a gate electrode 12.

The region 30 will be explained as follows. The substrate 10 is made of single crystal bulky silicon having a $N^-$ conductive type with an impurity concentration of $1 \times 10^{14}$ cm$^{-3}$. A base layer 11 as a P well having a P conductive type is formed in a surface portion of the substrate 10.

A trench as a groove is selectively formed in the base layer 11 such that the trench penetrates the base layer 11, and a bottom of the trench reaches the substrate 10. An insulation film (not shown) is formed on an inner wall of the trench. A poly silicon film is filled in the trench via the insulation film. The poly silicon film has an impurity concentration of $1 \times 10^{20}$ cm$^{-3}$. The poly silicon film provides the gate electrode 12. The device 100 includes multiple gate electrodes 12, which are commonly coupled with each other via a signal line 16 as a gate wiring. The driving signal is input from the gate pad 32 to each gate electrode 12 via the signal line 16 so that a predetermined voltage is applied to each gate electrode 12. Thus, the gate electrodes 12 have the same electric potential. Each gate electrode 12 extends along with a direction perpendicular to the thickness direction and the parallel direction so that the gate electrode 12 extends across the base layer 12. Thus, the gate electrodes 12 are arranged in parallel to each other along with the parallel direction so that the arrangement of the gate electrodes 12 has a stripe pattern. The base layer 11 is divided by the gate electrodes 12 into multiple first and second regions 13, 14, which are electrically separated from each other. The first and second regions 13, 14 are arranged in parallel to each other along with the parallel direction. The gate electrodes 12 include multiple pairs of gate electrodes 12. The first region 13 is sandwiched between a pair of gate electrodes 12, and the second region 14 is sandwiched between one pair and adjacent pair.

An emitter region 15 is selectively formed in a surface portion of the first region 13. The emitter region 15 contacts a sidewall of the gate electrode 12 via the insulation film in the trench. The emitter region 15 has a N+ conductive type with a high impurity concentration. The emitter region 15 has a thickness of 0.5 micrometers and an impurity concentration of $1 \times 10^{19}$ cm$^{-3}$. An emitter electrode 17 is formed on all of the first regions 13. The emitter electrode 17 is made of aluminum series material. The base layer 11 having the P conductive type and the emitter region 15 having the N conductive type in the first region 13 are electrically coupled with the emitter electrode 17. Thus, the first region 13 functions as a channel region for the IGBT. In addition, the first region 13 functions as an anode region for the FWD. Thus, the emitter electrode 17 functions as the emitter electrode of the IGBT and the anode electrode of the FWD.

No high impurity region having the N conductive type such as the emitter region 15 is arranged in a surface portion of the second region 14. The second regions 14 include multiple collector side second regions 14a and cathode side second regions 14b. The collector side second regions 14a are disposed directly above a collector region 18 in the thickness direction. All of the collector side second regions 14a are not connected to the gate electrode 12 and the emitter electrode 17 so that the collector side second regions 14a have a floating potential. The cathode side second regions 14b are disposed directly above a cathode region 19. All of the cathode side second regions 14b are electrically connected to the emitter electrode 17. Thus, all of the first regions 13 including the emitter regions 15 and all of the cathode side second regions 14b are coupled with the emitter electrode 17 so that the first regions 13 and the cathode side second regions 14b have the same electric potential. Thus, all of the cathode side second regions 14b function as the anode region of the FWD. The emitter electrode 17 functions as the anode electrode of the FWD with respect to the cathode side second region 14b. In FIG. 3, a left side of the drawing from a broken line provides a region including the collector region 18, and a right side of the drawing from the broken line provides a region including the cathode region 19.

Figure 32:
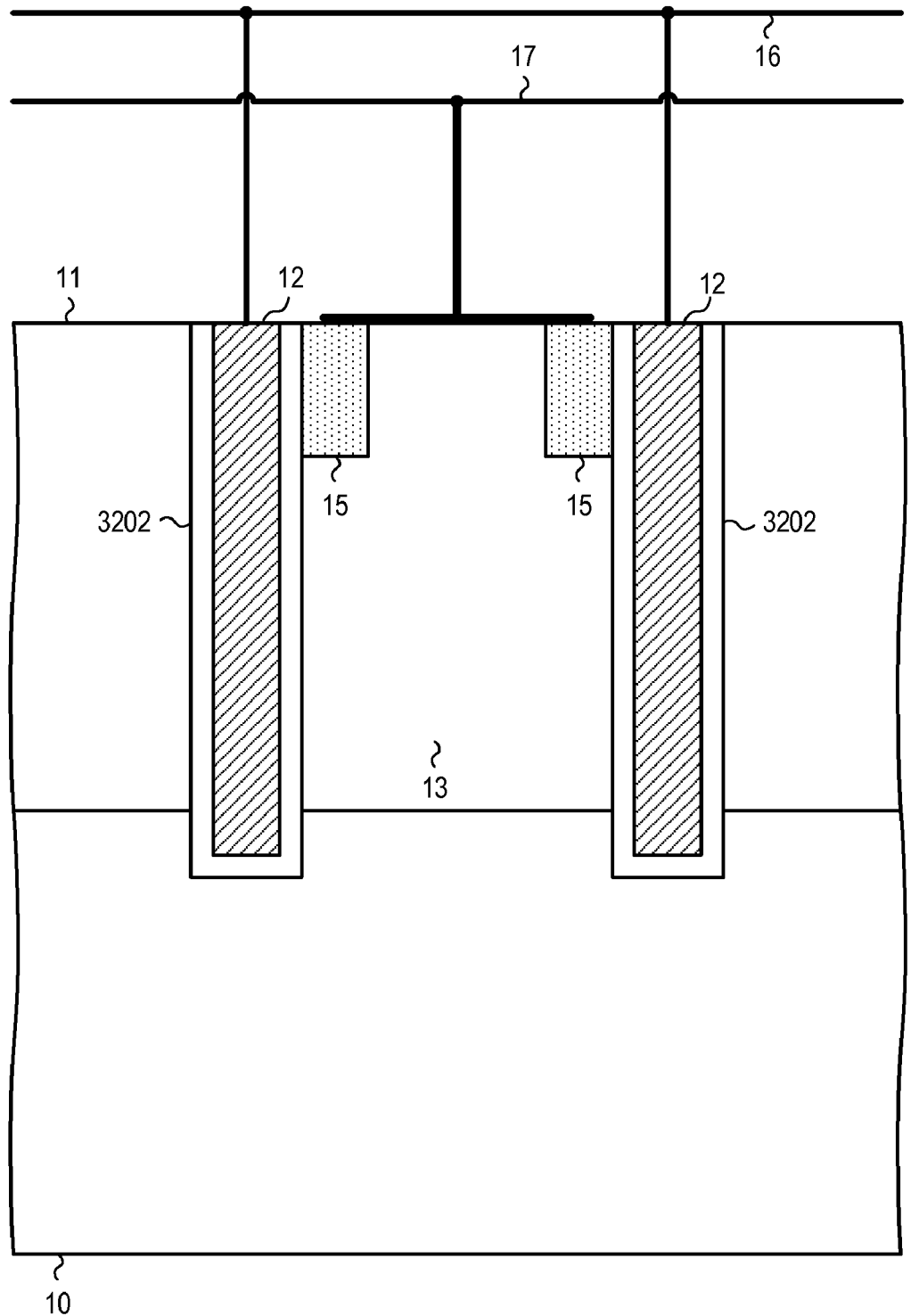
FIG. 32 is a diagram showing an enlarged cross sectional view of one element in the semiconductor device of FIG. 3.

FIG. 32 is a diagram showing an enlarged cross sectional view of one element in the semiconductor device of FIG. 3. As shown in FIG. 32, a trench is formed in the base layer 11 such that the trench penetrates the base layer 11, and a bottom of the trench reaches the substrate 10. An insulation film 3202 is formed on an inner wall of the trench. A poly silicon film is filled in the trench via the insulation film to provide the gate electrode 12. The device 100 includes multiple gate electrodes 12, which are commonly coupled with each other via a signal line 16 as a gate wiring. The gate electrodes 12 include multiple pairs of gate electrodes 12. The first region 13 is sandwiched between a pair of gate electrodes 12. An emitter region 15 is selectively formed in a surface portion of the first region 13. The emitter region 15 contacts a sidewall of the gate electrode 12 via the insulation film 3202 in the trench.

As shown in FIG. 3, the first regions 13 and the second regions 14 are alternately arranged in parallel to each other. A width of the second region 14 in the parallel direction is wider than a width of the first region 13. Pairs of gate electrodes 12 are periodically repeated along with the parallel direction at predetermined intervals. A contact region (not shown) is selectively formed in a surface region in the base layer 11 including the first region 13 and the cathode side second region 14b electrically coupled with the emitter electrode 17. The contact region has a thickness of 0.8 micrometers, and an impurity concentration of $1 \times 10^{19}$ cm$^{-3}$. The contact region has the P+ conductive type.

The collector region 18 having the P+ conductive type is formed in a surface portion of the substrate 10 on a backside of the substrate 10. The collector region 18 has a thickness of 0.5 micrometers, and an impurity concentration of $1 \times 10^{18}$ cm$^{-3}$. The cathode region 14 is arranged adjacent to the collector region 18 along with the parallel direction. The cathode region 19 has the N+ conductive type. The cathode region 19 has a thickness of 0.5 micrometers, and an impurity concentration of $1 \times 10^{18}$ cm$^{-3}$.

As shown in FIG. 2, the collector regions 18 having the width Wp and the cathode regions 19 having the width Wn are alternately arranged along with the parallel direction. Thus, multiple cathode regions 19 are arranged along with the parallel direction at intervals of Wp, and a residual portion of the substrate 10 provides the collector region 18. A ratio between the width Wp and the width Wn is defined as Wp/Wn, which is one-third in FIG. 2. The collector region 18 and the cathode region 19 are electrically coupled with the collector electrode 20 made of aluminum series material. Thus, the cathode electrode of the FWD and the collector electrode 20 of the IGBT are common. In FIG. 2, one of the cathode regions 19 is shorter than the other cathode regions 19. This is because the base layer 11 as the P well is formed on the surface side of the substrate 10 so as to avoid the gate pad 32.

As shown in FIG. 3, a field stop layer 21 having the N conductive type is formed between the substrate 10 and the collector region 18 or the cathode region 19 in the thickness direction. The field stop layer 21 has an impurity concentration, which is higher than the substrate and lower than the emitter region 15. In the device 100 having the IGBT with the trench type gate electrode 12, since the device 100 includes the field stop layer 21 for blocking a depletion layer, a thickness of the substrate 10 can be reduced, compared with other trench structures such as a punch through type trench structure and a non-punch through type trench structure. Thus, excess carrier is reduced, and a residual width of a neutral region is small when the depletion layer expands to the utmost limit. Accordingly, a SW loss (i.e., AC loss) of the IGBT is reduced. Here, the thickness from the surface of the base layer 11 to the surface of the collector region 18 is set to be 130 micrometers.

The semiconductor device 100 can be manufactured with a conventional semiconductor process.

The operation of the IGBT will be explained as follows. A predetermined collector voltage is applied between the emitter electrode 17 and the collector electrode 20, and a gate voltage is applied between the emitter electrode 17 and the gate electrode 12 so that a gate of the device turns on. Then, a channel having the N conductive type is formed in the first region 13 having the emitter region 15 thereon. Electrons are injected from the emitter electrode 17 into the substrate 10 via the channel. The injected electrons provide a forward bias state in the collector region 18 and the substrate 10. Thus, the hole is injected from the collector region 18, so that the resistance of the substrate 10 is much reduced. The current capacity of the IGBT increases. At this time, only the first region 13 in the base layer 11 having the emitter region 15 in the surface portion of the first region 13 functions as the IGBT. The second region 14 does not function as the IGBT. Further, when the gate voltage between the emitter electrode 17 and the gate electrode 12 is set to be zero or reverse bias, i.e., when the gate of the device 100 turns off, the channel, which is reversed to the N conductive type, returns to the P conductive type. Thus, the electron injection from the emitter electrode 17 stops. Together with the injection stop, the hole injection from the collector region 18 stops. Then, the carrier including the electrons and the holes accumulated in the substrate 10 are discharged from the emitter electrode 17 and the collector electrode 20, respectively, or the electrons and the holes are re-combined so that they are disappeared.

Next, the operation of the FWD will be explained as follows. The emitter electrode 17 and the anode electrode are common, and thereby, the cathode side second region 14b directly over the cathode region 19 functions as the anode region of the FWD. The cathode side second region 14b is a part of the base layer 11, which is electrically coupled with the emitter electrode 17. The anode voltage as the forward bias voltage is applied between the emitter electrode 17 and the substrate 10. When the anode voltage exceeds the threshold voltage, the anode region and the substrate 10 are biased forwardly so that the FWD flows current, i.e., the FWD conducts electricity. Specifically, when the collector voltage caused by energy accumulated in a load L is applied to the IGBT, the FWD between the anode region and the cathode region 19 including the substrate 10 conducts current so that the current flows through the FWD. When the reverse bias is applied between the emitter electrode 17 and the substrate 10, the depletion layer expands from the anode region to the substrate 10, and therefore, the reverse break down voltage is maintained.

In the device 100, all of the first regions 13 in the base layer 11 including the first region 13 over the collector region 18 and the cathode region 19 function as the channel region of the IGBT. Further, all of the first regions 13 functions as the anode region of the FWD. Thus, a part of the FWD is built in the IGBT. Accordingly, when the on-state voltage Von of the IGBT is set to be a predetermined voltage, the dimensions of the device 100 are improved. Specifically, the dimensions of the device 100 may be larger than a case where all of regions divided from the base layer 11 provide the first region 13, but smaller than a case where the IGBT and the FWD are separated from each other so that no gate electrode 12 is disposed in the region of the FWD.

Here, when all of the first regions 13 function as the channel region of the IGBT, the emitter region 15 is arranged in the surface portion in the first region 13. In general, when the distance between the collector region 18 and the first region 13 is short, the first region 13 easily functions as the channel region. The nearer the first region 13 over the cathode region 19 to the collector region 18, the easier the first region 13 functions as the channel region of the IGBT, i.e., the device 100 performs IGBT function. When the length of the cathode region 19 in the parallel direction is long, a part of the first regions 13, which is far from the collector region 18, may not perform the IGBT function although the part of the first regions 13 has a structure capable of functioning as the channel region. Similarly, when all of the first regions 13 function as the anode region of the FWD, the anode electrode is electrically coupled with the emitter electrode 15. In general, the shorter the distance between the cathode region 19 and the first region 13, the easier the first region 13 functions as the anode region of the FWD. The nearer the first region 13 over the collector region 18 to the cathode region 19, the easier the first region 13 functions as the anode region, i.e., the device 100 performs FWD function. Accordingly, when the length of the collector region 18 is long, a part of the first regions 13, which is far from the cathode region 19, may not perform the FWD function although the part of the first regions 13 has a structure capable of functioning as the anode region.

All of the cathode side second regions 14b are electrically coupled with the emitter electrode 17. Thus, all of the cathode side second regions 14b function as the anode region of the FWD. In this case, an area of the region functioning as the anode region is large, compared with a case where only the first regions 13 functions as the anode region. Specifically, an area of the region for functioning as the FWD becomes large. Thus, the forward voltage Vf of the FWD is reduced. Since the width of the second region 14 is wider than the width of the first region 13, a margin for FWD function increases. Thus, the forward voltage Vf of the FWD is reduced.

Only the cathode side second regions 14b over the cathode region 19 function as the anode region. The distance between the cathode side second region 14b and the cathode region 19 is short. The current path of the FWD becomes shorter, compared with a case where the collector side second region 14a over the collector region 18 functions as the anode region. Thus, the forward voltage Vf of the FWD is reduced.

Further, there is no emitter region 15 for providing the IGBT in the second region 14, i.e., the cathode side second region 14b. Thus, even when the driving signal is input into the gate electrode 12, i.e., even when the IGBT functions, the base layer 11 in the second region 14 and the substrate 10 adjacent to the base layer 11 do not have the same electric potential. Accordingly, difficulty of hole injection at the PN junction between the base layer 11 having the P conductive type and the substrate 10 having the N conductive type is avoided. The difficult of hole injection is cased by equalizing the electric potential of the base layer 11 and the substrate 10. Thus, the cathode side second region 14b performs the FWD function with or without input of the driving signal into the gate electrode 12. The cathode side second region 14b is not substantially affected by the potential of the gate electrode 12. Accordingly, when the gate of the IGBT turns on during the operation of the FWD, i.e., when the driving signal is input into the gate electrode 12 of the IGBT while the FWD functions, the increase of the forward voltage Vf of the FWD is restricted. Thus, in the device 100, the forward voltage Vf of the FWD is reduced, and the DC loss is also reduced.

All of the collector side second regions 14a are not electrically connected to the emitter electrode 17 so that the collector side second regions 14a have floating potential. Accordingly, the hole is not drawn to the emitter electrode 17 via the collector side second region 14a even when the driving signal is input into the gate electrode 12 so that the channel is formed in the first region 13 under the emitter region 15, i.e., even when the gate of the IGBT turns on. Thus, the hole is accumulated in the substrate 10. Thus, the on-state voltage Von of the IGBT is reduced.

Since the first region 13 is arranged over the collector region 18 and the cathode region 19, an occupancy area of the IGBT in the substrate 10 becomes large, compared with a case where the first region 13 is arranged only over the collector region 18. Thus, the on-state voltage Von of the IGBT is reduced. In the device 100, the on-state voltage Von of the IGBT is reduced, and the DC loss is also reduced.

In the device 100, the IGBT and the FWD are formed on the same substrate 10. The chip size of the device 100 is improved, and the forward voltage Vf of the FWD and the on-state voltage Von of the IGBT are reduced. Further, the DC loss of the device 100 is also reduced.

Figure 4:
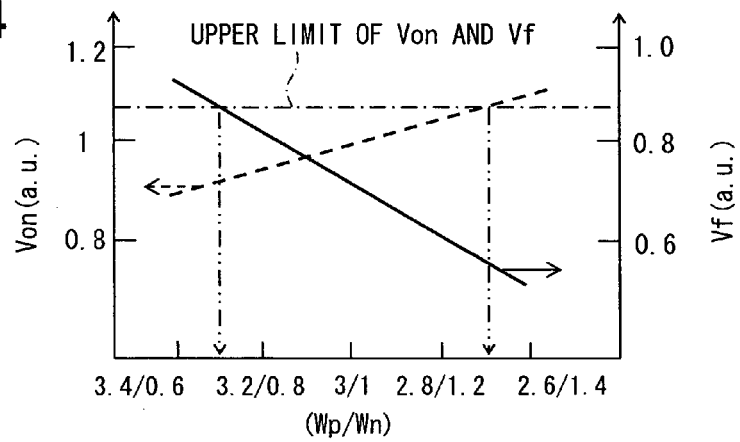
FIG. 4 is a graph showing a relationship among a width ratio between a collector region and a cathode region, an on-state voltage Von of an IGBT and a forward voltage Vf of a FWD.

The present inventor has studied about a relationship among the ratio of width between the collector region 18 and the cathode region 19, the on-state voltage Von and the forward voltage Vf. The result is shown in: FIG. 4. The solid line represents the forward voltage Vf of the FWD. The broken line represents the on-state voltage Von of the IGBT. The chain line represents the upper limit of the forward voltage Vf and the on-state voltage Von. When the ratio of width Wp/Wn increases, i.e., when the width of Wp of the collector region 18 increases, the IGBT functions easily, so that the on-state voltage Von of the IGBT is reduced. When the ratio of width decreases, i.e., when the width of Wn of the cathode region 19 increases, the FWD easily functions, so that the forward voltage Vf of the FWD is reduced. A cross point between the chain line and the solid line has the ratio of width of 3.1/0.7, and another cross point between the chain line and the broken line has the ratio of width of 2.7/1.3. When the ratio of width is set to be in a range between 3.1/0.7 and 2.7/1.3, the on-state voltage Von of the IGBT is small, and the forward voltage Vf of the FWD is also small. In this embodiment, the ratio of width, i.e., the PN width ratio (Wp/Wn) is set to be one-third, which is the center of the above range between 3.1/0.7 and 2.7/1.3. Thus, even if the ratio is varied in a manufacturing process, the on-state voltage Von of the IGBT is small, and the forward voltage Vf of the FWD is also small.

In the first embodiment, the first region 13, in which the emitter region 15 as the high impurity concentration region with the N conductive type is formed, and the second region 14 are alternately arranged via the gate electrode 12 as the trench gate structure so that the first region 13 and the second region 14 have the stripe pattern. Accordingly, in the substrate 10, the FWD and the IGBT function uniformly.

Second Embodiment

Figure 5:
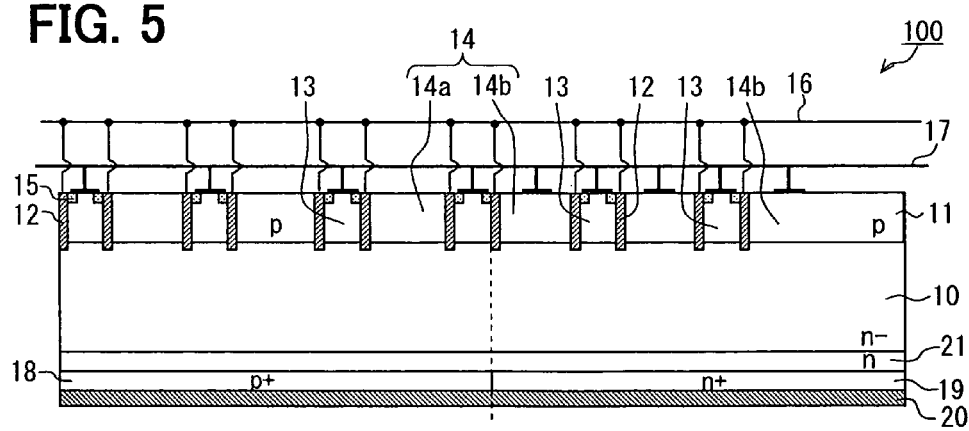
FIG. 5 is a diagram showing a cross sectional view of a semiconductor device according to a second embodiment.

FIG. 5 shows a semiconductor device 100 according to a second embodiment.

In FIG. 3, the first region 13 having the emitter region 15 in the surface portion of the first region 13 is arranged directly over the collector region 18 and the cathode region 19. The forming area of the first region 13 is not specified. For example, multiple first regions 13 are repeatedly arranged at predetermined intervals along with the parallel direction.

In FIG. 5, the gate electrode 12 and the first region 13 are formed in a part of the base layer 11 directly over the cathode region 19. Specifically, they are formed from a boundary between the cathode region 19 and the collector region 18 to a predetermined range of the cathode region 19. The cathode side second region 14b is formed in the other part of the base layer 11 over the cathode region 19. The device in FIG. 5 is formed as follows. Specifically, in FIG. 3, one of three first regions 13 over the cathode region 19 is removed. The one of the first regions 13 is disposed farthest from the collector region 18. Further, a pair of gate electrodes 12 farthest from the collector region 18 is also removed. The width of the cathode side second region 14b on the right side of the first region 13 becomes wider than the width of other cathode side second regions 14b. In FIG. 5, the first region 13 and the second region 14 are alternately arranged along with the parallel direction.

Multiple gate electrodes 12 are not formed in a whole of the base layer 11 disposed directly over the cathode region 19, but formed in a part of the base layer 11, which is near the collector region 18. The cathode side second region 14b is formed in a whole of a region, in which the gate electrode 12 is not formed. Specifically, the second region 14b is formed in a whole of the region, which is disposed far from the collector region 18 so that the region does not easily function as the IGBT. In this case, the area of the anode region in the substrate 10 much increases, and thereby, the area for functioning as the FWD much increases. Thus, the forward voltage Vf of the FWD is much reduced.

The area of the cathode side second region 14b for functioning as the anode region of the FWD increases, compared with the device 100 in FIG. 3. Both of the first region 13 and the second region 14 over the cathode region 19 functions as the anode region of the FWD. The cathode side second region 14b is not affected by the electric potential of the gate electrode 12, so that the base layer 11 and the substrate 10 do not have the same potential even when the IGBT functions. Thus, the increase of the forward voltage Vf of the FWD is restricted when the gate of the IGBT turns on during the operation of the FWD. In the device 100 in FIG. 5, the forward voltage Vf of the FWD is much reduced.

The gate electrode 12 and the first region 13 are formed in a part of the base layer 19 over the cathode region 19, which is near the collector region 18. Specifically, the gate electrode 12 and the first region 13 are formed in the part of the base layer 19, which easily functions as the IGBT. The second region 14a over the collector region 18 has the floating potential. Accordingly, the on-state voltage Von of the IGBT is reduced, compared with a case where the first region 13 is formed only over the collector region 18. The on-state voltage Von of the device in FIG. 5 is slightly larger than that in FIG. 3.

In FIG. 5, the collector region 18 is disposed only on the left side of the cathode region 19. Alternatively, the collector region 18 may be disposed on both sides of the cathode region 19. In this case, the gate electrode 12 and the first region 13 may be formed in a part of the base layer 11 over the cathode region 19, which is disposed in a predetermined range from the interface between the collector region 18 and the cathode region 19. The part of the base layer 11 is disposed on both sides of the cathode region 19. The cathode side second region 14b is formed in the other part of the base layer 11. Specifically, the gate electrode 12 and the first region 13 are formed in a predetermined range of the base layer 11, which is disposed on both sides of the cathode region 19. They are formed in a predetermined periphery region of the base layer 11 over the cathode region 19, which is defined as a right and left side adjacent regions. The second region 14b is formed in a whole of a center region sandwiched between the right and left side adjacent regions.

Third Embodiment

Figure 6:
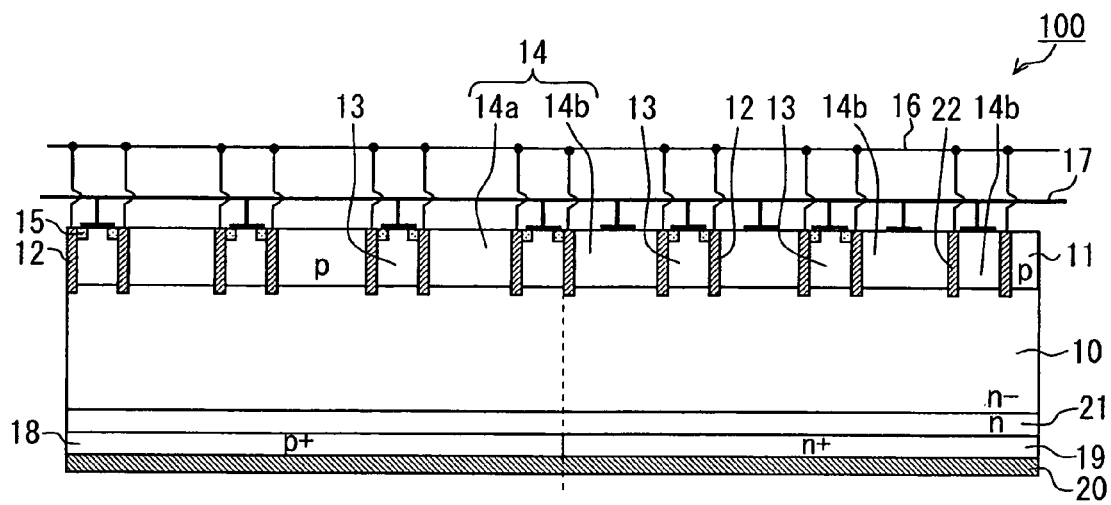
FIG. 6 is a diagram showing a cross sectional view of a semiconductor device according to a third embodiment.

FIG. 6 shows a semiconductor device according to a third embodiment.

The gate electrode 12 and the first region 13 are formed only in a part of the base layer 11 disposed directly over the cathode region 19. The part of the base layer 11 is disposed in a predetermined range from an interface between the cathode region 19 and the collector region 18. The interface is defined as a broken line in FIG. 6. The part of the base layer 11 is defined as an adjacent region of the collector region 18. Multiple dummy gate electrodes 22 are formed in the other part of the base layer 11 over the cathode region 19. The dummy gate electrode 22 has the same potential as the gate electrode 12, and is made of the same material as the gate electrode 12. Further, the dummy gate electrode 22 has the same structure as the gate electrode 12. The cathode side second region 14b is formed in a region sandwiched between a pair of dummy gate electrodes 22. The second region 14b sandwiched between a pair of the dummy gate electrodes 22 is electrically coupled with the emitter electrode 17.

The device 100 in FIG. 6 is prepared as follows. One of three first regions 13 over the cathode region 19 in FIG. 3 is replaced with the cathode side second region 14b, which does not have the emitter region 15 in a surface portion of the second region 14b. The one of the first regions 13 is disposed farthest from the collector region 18. The second region 14b functions only as the anode region of the FWD. Specifically, the cathode side second region 14b is formed in the other part of the base layer 11 over the cathode region 19. The dummy gate electrode 22 is formed in the cathode side second region 14b over the cathode region 19. Two pairs of the gate electrodes 12 and one or more pairs of the dummy gate electrode 22 are repeatedly formed in the base layer 11 over the cathode region 19 along with the parallel direction at predetermined intervals.

Similar to the second embodiment, multiple gate electrodes 12 are not formed uniformly in a whole of the base layer 11 over the cathode region 19, but formed in a part of the base layer 11 in a predetermined range from the interface between the collector region 18 and the cathode region 19. Specifically, the first region 13 is formed in the part of the base layer 11 over the cathode region 19, which is near the collector region 18. The cathode side second region 14b having no emitter region 15 is formed in the other part of the base layer 11 over the cathode region 19, which is far from the collector region 18. The gate electrode 12 is not formed in the other part of the base layer 11. In this case, the region for functioning as the anode region in the substrate 10 and the region for functioning as the FWD are large, compared with the device in FIG. 3. Thus, the forward voltage Vf of the FWD is much reduced.

Since the cathode side second region 14b having no emitter region 15 is arranged between the dummy gate electrodes 22, the ratio of area between the cathode side second region 14b and the region for functioning as the anode region increases, compared with the device in FIG. 3. The cathode side second region 14b is not affected by the potential of the gate electrode 12 so that the base layer 11 and the substrate 10 do not have the same potential even when the IGBT functions. The region for functioning as the anode region includes the first region 13 and the cathode side second region 14b. Accordingly, when the FWD functions, and the gate of the IGBT turns on, the increase of the forward voltage Vf of the FWD is restricted. In the device 100 in FIG. 6, the forward voltage Vf of the FWD is much reduced.

The gate electrode 12 and the first region 13 are formed in the part of the base layer 11 over the cathode region 19, which is near the collector region 18. The collector side second region 14a over the collector region 18 has a floating potential. Accordingly, the on-state voltage Von of the IGBT is reduced, compared with a case where the first region 13 is formed only over the collector region 18. The on-state voltage Von of the device 100 in FIG. 6 is slightly larger than that in FIG. 3.

Multiple dummy gate electrodes 22 are formed in the part of the base layer 11 over the cathode region 19, in which the gate electrode 12 is not formed. The dummy gate electrode 22 has the same structure and the same electric potential as the gate electrode 12. Thus, the area of the anode region in FIG. 6 is slightly smaller than that in FIG. 5. However, a surface structure of the substrate 10 is uniformed, and an equipotential line is substantially uniformed. Thus, unevenness of an electric field is reduced. Specifically, reduction of the break down voltage of the IGBT is restricted although the gate electrode 12 is not formed in the other part of the base layer 11 over the cathode region 19.

Similar to the second embodiment, in the present embodiment, the collector region 18 may be arranged on both sides of the cathode region 19. In this case, the gate electrode 12 and the first region 13 are formed in both periphery parts of the base layer 11 over the cathode region 19. The dummy gate electrode 22 is formed in the other part of the base layer 11, which is disposed in a center portion of the base layer 11.

Fourth Embodiment

Figure 7:
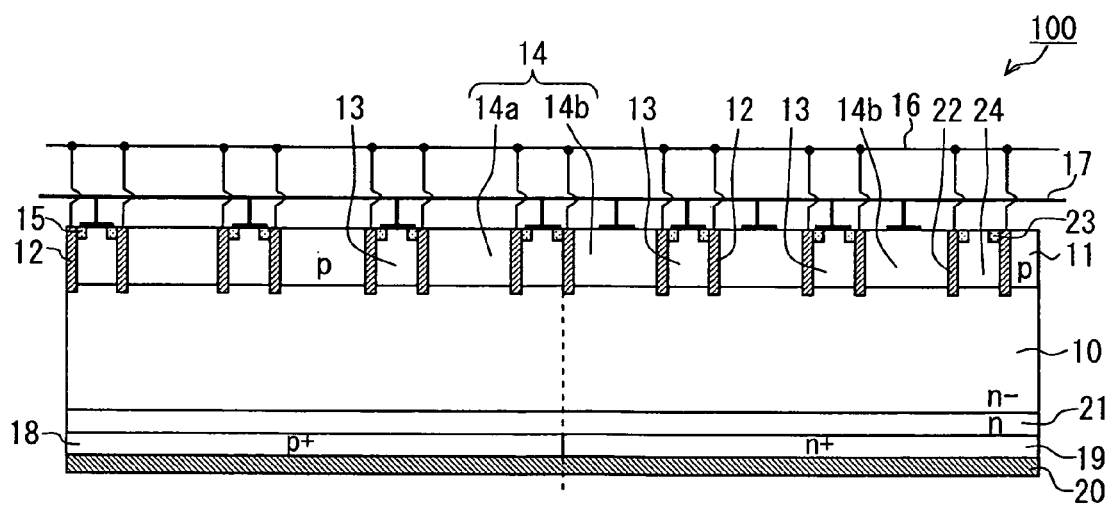
FIG. 7 is a diagram showing a cross sectional view of a semiconductor device according to a fourth embodiment.

FIG. 7 shows a semiconductor device 100 according to a fourth embodiment.

Similar to the second and third embodiments, the gate electrode 12 and the first region 13 are formed in a part of the base layer 11 over the cathode region 19, which is arranged in a predetermined region from the end of the collector region 18 along with the parallel direction. The end of the collector region 18 is shown as a broken line in FIG. 7. The cathode region 19 is adjacent to the collector region 18. The dummy gate electrode 22 is formed in the other part of the base layer 11 over the cathode region 19. The dummy gate electrode 22 has the same structure and the same electric potential as the gate electrode 12. The dummy gate electrode 22 has the same trench gate structure as the gate electrode 12. A dummy emitter region 23 having the N$^+$ conductive type is selectively formed in a surface portion sandwiched between the dummy gate electrodes 22. The dummy emitter region 23 has the same structure as the emitter region 15. The dummy emitter region 23 is adjacent to a sidewall of the dummy gate electrode 22. Further, a third region 24 having the dummy emitter region 23 formed in a surface portion of the third region 24 is sandwiched between the dummy gate electrodes 22. The third region 24 has a floating potential.

The device in FIG. 7 is prepared as follows. One of three first regions 13 over the cathode region 19 in FIG. 3 is replaced with the third region 24 having the floating potential. The one of the first regions 13 is disposed farthest from the collector region 18. The first region 13 with the emitter region 15, the third region 24 with the dummy emitter region 23 and the second region 14 are alternately arranged along with the parallel direction in the base layer 11 over the cathode region 19. Further, multiple pairs of gate electrodes 12 and multiple pairs of dummy gate electrodes 22 are alternately arranged along with the parallel direction at predetermined pitches. However, since the third region 24 has the floating potential, a pair of the dummy gate electrodes 22 for separating the third region 24 from the second region 14 has the same structure and the same potential as a pair of the gate electrodes 12. Although the dummy emitter region 23 has the same structure as the emitter region 15, the dummy emitter region 23 and the dummy gate electrode 22 do not functions as the IGBT.

In this embodiment, similar to the second and third embodiments, multiple gate electrodes 12 are not formed uniformly in a whole of the base layer 11 over the cathode region 19, but formed only in a predetermined region near the collector region 18. Thus, the first region 13 is formed only in a part of the base layer 11 over the cathode region 19, which is near the collector region 18. The third region 24 is separated from the cathode side second region 14b by the dummy gate electrodes 22, and the third region 24 is formed in the part of the base layer 11, in which the gate electrode 12 is not formed. The part of the base layer 11 is disposed far from the collector region 18. The third region 24 together with the dummy emitter region 23 formed in the surface portion of the third region 24 has a floating potential. The third region 24 does not function as the channel region of the IGBT. Further, the third region 24 also does not function as the anode region of the FWD. In this case, the region for functioning as the anode region of the FWD includes the first region 13 and the cathode side second region 14b. The ratio of the cathode side second region 14b is larger than that in FIG. 3. The cathode side second region 14b is not affected by the potential of the gate electrode 12, so that the base layer 11 and the substrate 10 do not have the same potential even when the IGBT functions. Thus, when the gate of the IGBT turns on during the operation of the FWD, the increase of the forward voltage Vf of the FWD is limited. Thus, the forward voltage Vf of the FWD is much reduced.

In this embodiment, the gate electrode 12 and the first region 13 are formed in the part of the base layer 11 over the cathode region 19, which is near the collector region 18. The collector side second region 14a over the collector region 18 has a floating potential. Accordingly, the on-state voltage Von of the IGBT in FIG. 7 is slightly larger than that in FIG. 3. However, the on-state voltage Von of the IGBT in FIG. 7 is reduced, compared with a case where the first region 13 is formed only over the collector region 18.

Multiple dummy gate electrodes 22 instead of the gate electrodes 12 are formed in the other part of the base layer 11 over the cathode region 19, in which the gate electrode 12 is not formed. The dummy gate electrode 22 has the same structure and the same electric potential as the gate electrode 12. Thus, the ratio of area of the anode region in the FWD in FIG. 7 is slightly smaller than that in FIG. 5. However, the structure of the substrate 10 on the front side is uniformed, and an equipotential line is substantially uniformed. Thus, unevenness of an electric field is reduced. Specifically, reduction of the break down voltage of the IGBT is restricted although the gate electrode 12 is not formed in the other part of the base layer 11 over the cathode region 19.

The third region 24 having the dummy emitter region 23 and sandwiched between the dummy gate electrodes 22 has the floating potential. A part of the base layer 11 over the cathode region 19, which is sandwiched between the gate electrodes 12 and has the emitter region 15 in a surface portion of thereof, provides the first region 15 connecting to the emitter electrode 17. The other part of the base layer 11 over the cathode region 19, which is sandwiched between the dummy gate electrodes 22 and has the dummy emitter region 23 in a surface portion thereof, provides the third region 24 disconnecting to the emitter electrode 17 so that the third region 24 does not function as the IGBT and the FWD. Accordingly, by using one mask for forming connection with the emitter electrode 17, the ratio of area between the first region 13 and the third region 24 in the base layer 11 over the cathode region 18 is adjusted. Since the emitter region 15 is arranged in the surface portion of the first region 13, the base layer 11 in the first region 13 and the substrate 10 has the same potential when the IGBT functions. Thus, hole injection at the PN-junction is prevented. Thus, when the first region 13 functions as the anode region of the FWD, the forward operation of the FWD is affected by the gate potential. However, since the third region 24 has the floating potential, the third region 24 does not function as the anode region of the FWD. Thus, by using the one mask, influence of the potential in the gate electrode 12 to the forward voltage Vf of the FWD can be controlled. Thus, when the device 100 is manufactured, the influence of the potential of the gate electrode 12 is easily and simply adjusted by the one mask.

Similar to the second embodiment, when the collector region 18 is disposed on both ides of the cathode region 19 along with the parallel direction, the gate electrode 12 and the first region 13 are formed in a predetermined range from each interface between the cathode region 19 and the collector region 18. The dummy gate electrode 22, the dummy emitter region 23 and the third region 24 are formed in a residual part (i.e., a center part) of the base layer 11.

Fifth Embodiment

Figure 8:
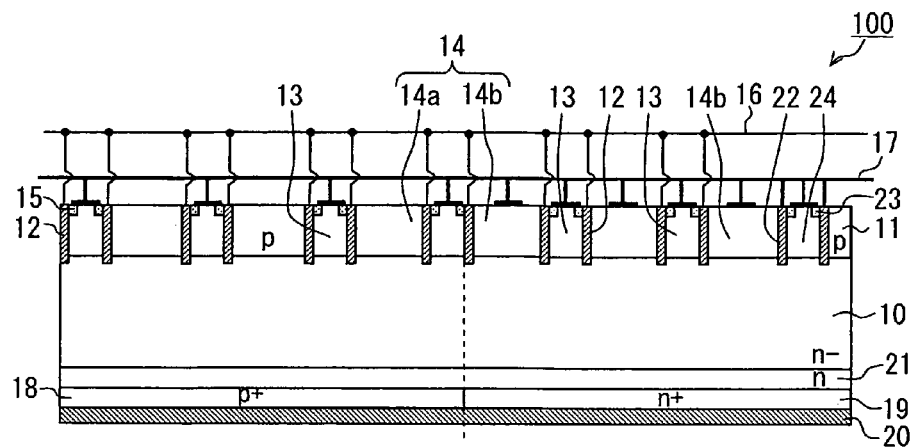
FIG. 8 is a diagram showing a cross sectional view of a semiconductor device according to a fifth embodiment.

FIG. 8 shows a semiconductor device according to a fifth embodiment.

In FIG. 7, the third region 24 separated from the cathode side second region 14b with a pair of dummy gate electrodes 22, and having the dummy emitter region 23 in the surface portion of the third region 24 has the floating potential, so that the third region 24 does not function as the IGBT and the FWD. In FIG. 8, the dummy gate electrode 22 does not have the same potential as the gate electrode 12, but the dummy gate electrode 22 together with the dummy emitter region 23 and the third region 24 is electrically coupled with the emitter electrode 17. Specifically, the driving signal is not input into the dummy gate electrode 22 so that the third region 24 does not function as the IGBT.

Similar to the second to fourth embodiments, multiple gate electrodes 12 are not uniformly formed in a whole of the base layer 11 over the cathode region 19, but formed only in a predetermined range from the interface between the collector region 18 and the cathode region 19. Specifically, the first region 13 is formed only in a part of the base layer 11 over the cathode region 19, which is near the collector region 18. The dummy gate electrode 22 is formed in the other part of the base layer 11, in which the gate electrode 12 is not formed. The other part of the base layer 11 is disposed far from the collector region 18. The third region 24 is sandwiched between the dummy gate electrodes 22. The dummy emitter region 23 is selectively formed in a surface portion of the third region 24. The dummy gate electrode 22, the dummy emitter region 23 and the third region 24 are electrically coupled with the emitter electrode 17. Thus, the third region 24 does not function as the channel region of the IGBT. The third region 24 functions only as the anode region of the FWD. In this case, the region for functioning as the anode region in the substrate 10 becomes large, and the region for functioning as the FWD becomes large. Thus, the forward voltage Vf of the FWD is much reduced.

The ratio between the region not affected by the potential of the gate electrode 12 and the region for functioning as the anode region of the FWD is larger than that in FIG. 3. The region not affected by the potential includes the second region 14b and the third region 24, and provides such that the base region 11 and the substrate 10 does not have the same potential even when the IGBT functions. The region for functioning as the anode region includes the first region 13, the second region 14b and the third region 24. Thus, when the gate of the IGBT turns on during the operation of the FWD, the increase of the forward voltage Vf of the FWD is restricted. Thus, in the semiconductor device 100, the forward voltage Vf of the FWD is much reduced.

The gate electrode 12 and the first region 13 near the collector region 18 are formed in the base layer 11 over the cathode region 19. The collector side second region 14a over the collector region 18 has the floating potential. Accordingly, although the on-state voltage Von of the UGBT is slightly larger than that in FIG. 3, the on-state voltage Von is reduced, compared with a case where the first region 13 is formed only over the collector region 18.

Further, similar to the second embodiment, when the collector region 18 is arranged on both sides of the cathode region 19, the gate electrode 12 and the first region 13 are formed only in a predetermined range from both ends of the cathode region 19. The dummy gate electrode 22, the dummy emitter region 23 and the third region 24 are formed in other part of the cathode region 19.

Sixth Embodiment

Figure 9:
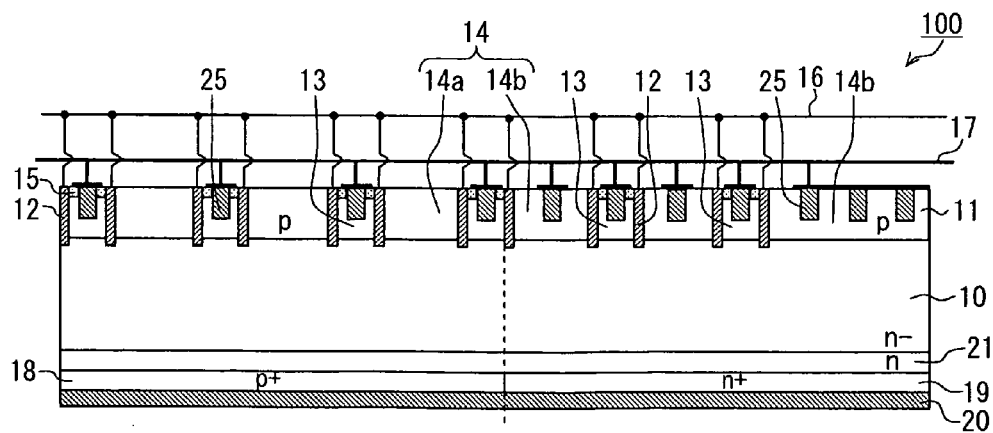
FIG. 9 is a diagram showing a cross sectional view of a semiconductor device according to a sixth embodiment.

A semiconductor device according to a sixth embodiment is shown in FIG. 9.

A trench contact portion 25 is formed in a region connecting to the emitter electrode 17. Specifically, the trench contact portion 25 is formed in the first region 13 and the cathode side second region 14b. The trench contact portion 14b contacts the emitter electrode 17, and is formed in a surface portion of the region. The trench contact portion 25 is a contact region in a trench, which is formed in the base layer 11 and has a depth shallower than the base layer 11. The trench contact portion 25 is made of conductive material such as tungsten. The trench contact portion 25 is prepared such that a $P^+$ conductive type contact region in FIG. 5 is replaced to the trench contact portion 25. The trench contact portion 25 is formed by a conventional semiconductor process.

A part of each of the first region 13 and the cathode side second region 14b, which functions as the anode region and provides a high impurity concentration portion of the base layer 11, is removed when the trench for the trench contact portion 25 is formed. Thus, injection of holes from the first region 13 and the cathode side second region 14b to the substrate side is reduced, compared with a case where the device does not include the trench contact portion 25, when the FWD functions. Accordingly, when the FWD is switched from the operation state to the non-operation state, i.e., when the FWD is switched from the on-state to the off state, the recovery current Irr flowing reversely and instantaneously is reduced. Specifically, the recovery current Irr flows in a direction opposite to a case where the FWD is in the operation state. Thus, the SW loss, i.e., the AC loss is reduced. In addition to reduction of the DC loss, the reduction of the AC loss provides to reduce electricity loss in the device 100.

In FIG. 9, the trench contact portion 25 is prepared to form in the first region 13 and the cathode side second region 14b in FIG. 5. The trench contact portion 25 may be formed in a region for functioning as the anode region of the FWD, which is connected to the emitter region 17. Accordingly, the trench contact portion 25 may be formed in the region connected to the emitter region 17 in FIGS. 6-8. For example, in FIG. 8, the trench contact portion 25 may be formed in the first region 13, the cathode side second region 14b and the third region 24, which are arranged over the cathode region 19.

A low lifetime layer may be formed at a boundary between the base layer 11 and the substrate 10 by irradiating an electron beam and/or a Helium atom beam. The low lifetime layer reduces a carrier density under the base layer 11. Accordingly, the carrier density near the region for functioning as the anode region becomes small, and thereby, the recovery current Irr is reduced so that the SW loss becomes small.

Seventh Embodiment

Figure 10:
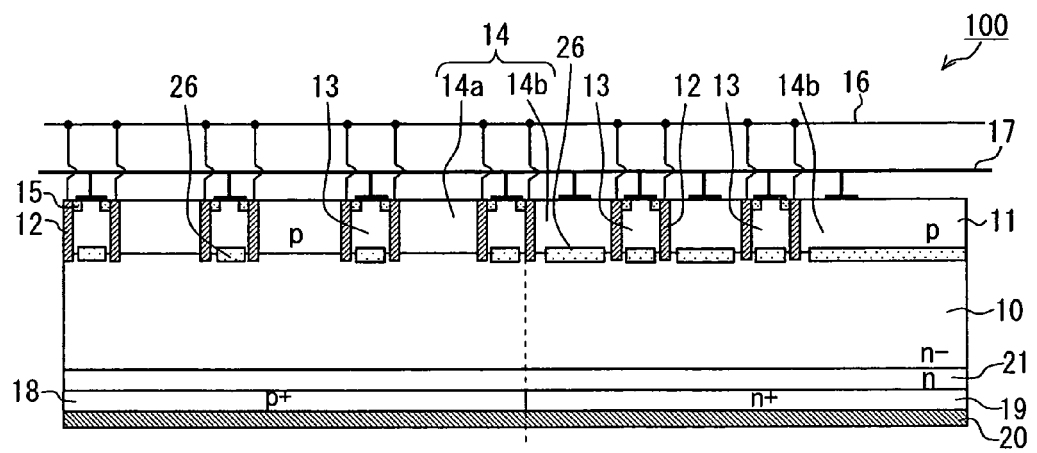
FIG. 10 is a diagram showing a cross sectional view of a semiconductor device according to a seventh embodiment.

FIG. 10 shows a semiconductor device according to a seventh embodiment.

A N conductive type semiconductor layer 26 as a N well is formed in a region connecting to the emitter electrode 17. Specifically, the semiconductor layer 26 is formed between the cathode side second region 14b and the substrate 10 and between the first region 13 and the substrate 10. The semiconductor layer 26 has an impurity concentration, which is higher than the substrate 10 and lower than the emitter region 15. For example, the semiconductor layer 26 has an impurity concentration of $1 \times 10^{16}$ cm$^{-3}$. The semiconductor layer 26 is formed by a conventional semiconductor process.

Since the device 100 includes the semiconductor layer 26, the semiconductor layer 26 provides a barrier with respect to holes, which is injected from the collector region 18 when the IGBT functions. Thus, the holes is not injected from the substrate side to the region connecting to the emitter electrode 17, the region including the first region 13 and the second region 14b. Thus, the holes are accumulated near the semiconductor layer 26, and thereby, the on-state voltage Von of the IGBT is reduced.

Further, the injection amount of holes from the first region 13 and second region 14b to the substrate side is reduced when the FWD functions, compared with a case where the device 100 has no semiconductor layer 26 as a barrier. Thus, when the FWD is switched to the non-operation state, i.e., when the FWD switched from the on-state to The off-state, the recovery current Irr is reduced. Furthermore, the SW loss is reduced. In addition to the reduction of the DC loss, the reduction of the SW loss provides to reduce the electricity loss in the device 100.

The semiconductor layer 26 is prepared such that the layer 26 is formed between the cathode side second region 14b and the substrate 10 and between the first region 13 and the substrate 10 in the device 100 in FIG. 5. Alternatively, the semiconductor layer 26 may be formed in the region connecting to the emitter electrode 17 in FIGS. 6-9, the region functioning as the anode of the FWD.

Figure 11:
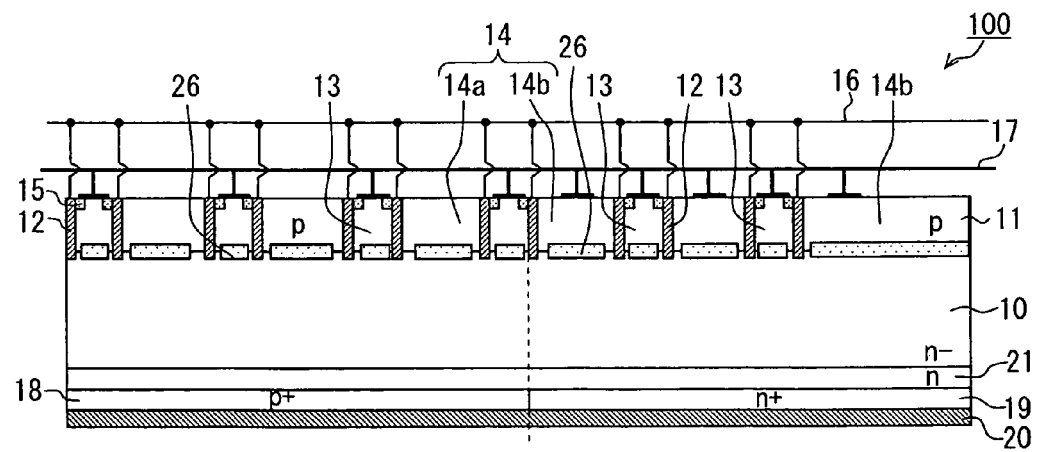
FIG. 11 is a diagram showing a cross sectional view of a semiconductor device according to a modification of the seventh embodiment.

In FIG. 10, the semiconductor layer 26 is formed only between the cathode side second region 14b and the substrate 10 and between the first region 13 and the substrate 10. Alternatively, as shown in FIG. 11, the semiconductor layer 26 may be formed between the collector side second region 14a and the substrate 10. When the semiconductor layer 26 is formed with respect to the collector side second region 14a having the floating potential, electrons injected from the emitter region 15 to the first region 13 may expand under the collector side second region 14a when the IGBT functions. Accordingly, the on-state voltage Von of the IGBT is much reduced since the current path expands.

In FIGS. 10 and 11, the semiconductor layer 26 is separated from the gate electrode 12. In this case, the electric field concentration near the gate electrode 12 is restricted. Thus, the breakdown voltage of the IGBT and the FWD is improved. Alternatively, the semiconductor layer 26 may contact the gate electrode 12. In this case, the semiconductor layer 26 may penetrate through the gate electrode 12.

Eighth Embodiment

Figure 12:
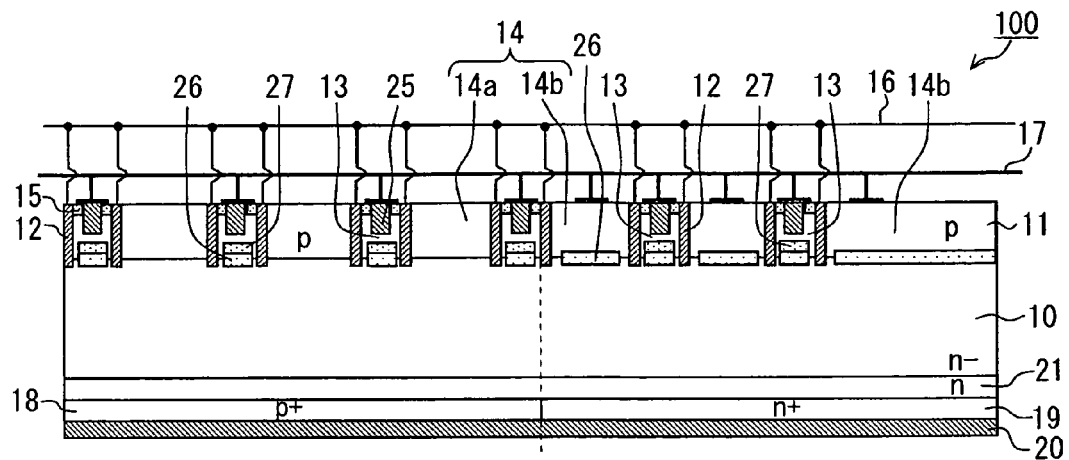
FIG. 12 is a diagram showing a cross sectional view of a semiconductor device according to an eighth embodiment.

FIG. 12 shows a semiconductor device according to an eighth embodiment.

In FIG. 10, the semiconductor layer 26 is formed between the first region 13 or the second region 14b connecting to the emitter electrode 17 and the substrate 10. In FIG. 12, the trench contact portion 25 is formed in the first region 13, similar to the device in FIG. 9. A P conductive type high impurity concentration layer 27 as a P well is formed between the semiconductor layer 26 and the trench contact portion 25.

The high impurity concentration layer 27 has the P conductive type, and has an impurity concentration, which is higher than the base layer 11. For example, the impurity concentration of the high impurity concentration layer 27 is $1 \times 10^{17}$ cm$^{-3}$. The high impurity concentration layer 27 is formed by a conventional semiconductor process.

Thus, the device 100 in FIG. 12 has an effect of the trench contact portion 25 described in the sixth embodiment and an effect of the semiconductor layer 26 described in the seventh embodiment.

Further, since the high impurity concentration layer 27 is formed between the trench contact portion 25 and the semiconductor layer 26, the reduction of the breakdown voltage of the IGBT is restricted although the distance between a contact region for the emitter electrode 17 and the semiconductor layer 26 is short.

Figure 13:
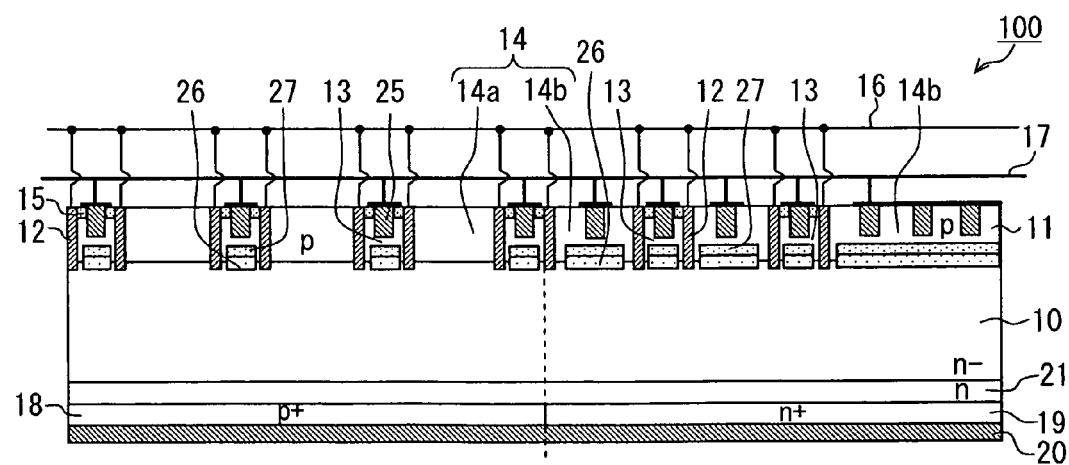
FIG. 13 is a diagram showing a cross sectional view of a semiconductor device according to a modification of the eighth embodiment.

In FIG. 12, the trench contact portion 25 is formed only in the first region 13, and the high impurity concentration layer 27 is formed between the trench contact portion 25 and the semiconductor layer 26. Alternatively, the trench contact portion 25 may be formed in all of the regions connecting to the emitter electrode 17 as shown in FIG. 9, and the high impurity concentration layer 27 may be formed between the trench contact portion 25 and the semiconductor layer 26. For example, as shown in FIG. 13, the trench contact portion 25 is formed not only in the first region 13 but also in the cathode side second region 14b. The high impurity concentration layer 27 is formed between the trench contact portion 25 and the semiconductor layer 26. In this case, the SW loss is much reduced. Further, since the high impurity concentration layer 27 is formed in the second region 14b, the reduction of the breakdown voltage of the FWD is restricted together with the effect of the semiconductor layer 26.

Ninth Embodiment

Figure 14:
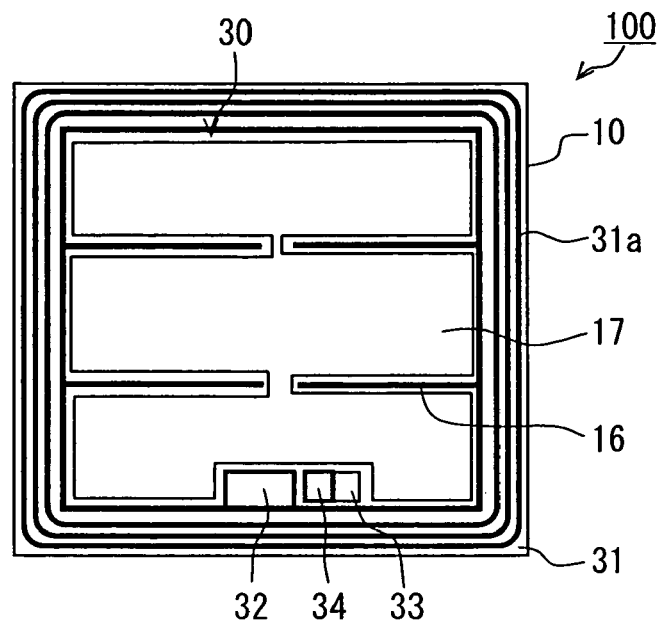
FIG. 14 is a diagram showing a plan view of a front side of a semiconductor device according to a ninth embodiment.
Figure 15:
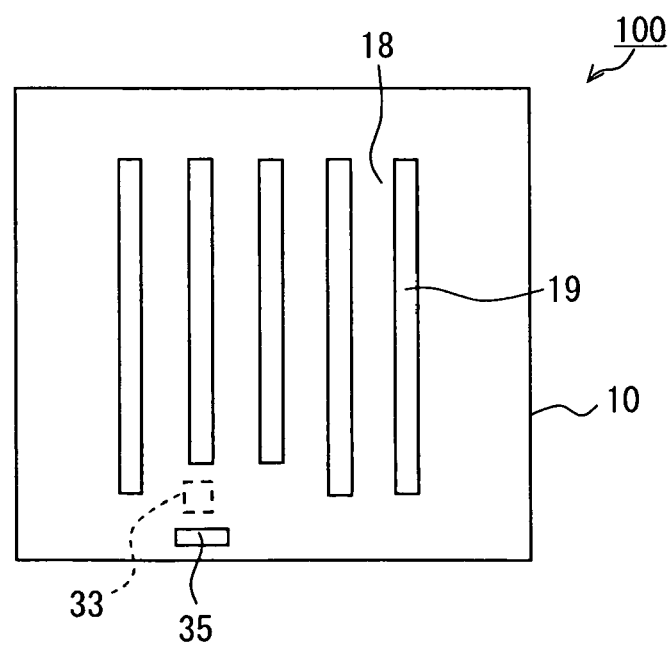
FIG. 15 is a diagram showing a plan view of a backside of the semiconductor device in FIG. 14.
Figure 16:
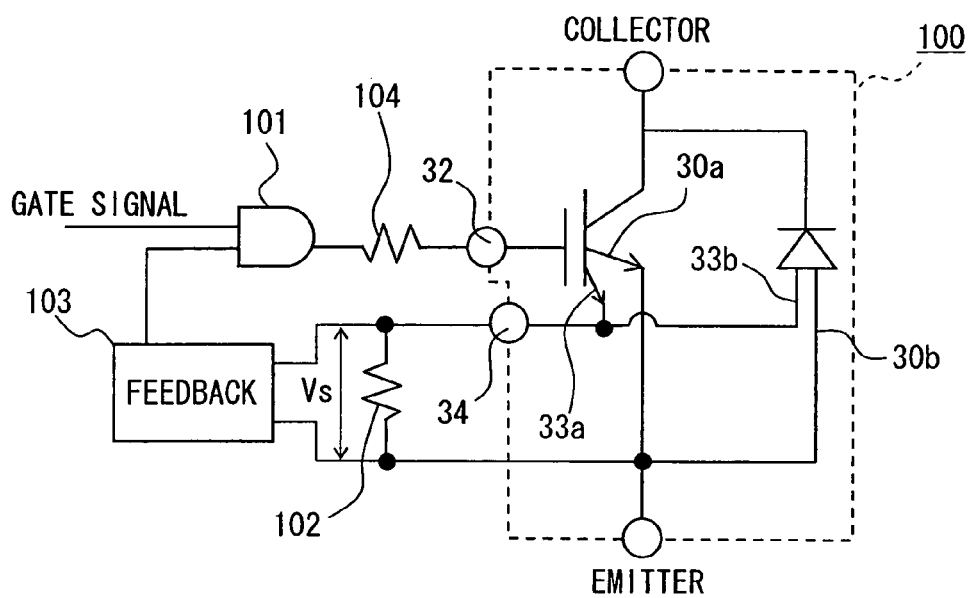
FIG. 16 is a circuit diagram showing a feedback circuit having the semiconductor device in FIGS. 14 and 15.
Figure 17:
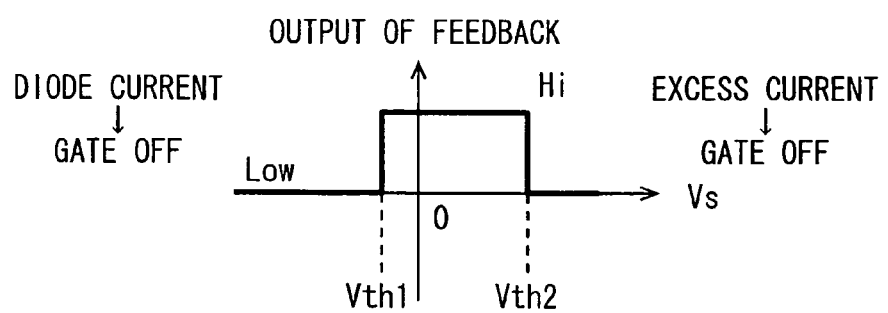
FIG. 17 is a diagram showing a relationship between a potential difference Vs of both ends of a sense resistor and an output voltage of a feedback portion.

FIGS. 14 to 17 show a semiconductor device 100 according to a ninth embodiment. FIG. 14 is a plan view showing the front side of the device 100, and FIG. 15 is a plan view showing the backside of the device 100. FIG. 16 is a circuit diagram showing a feedback circuit including the device 100 in FIGS. 14 and 15. FIG. 17 shows a relationship between a potential difference between both ends of a sense resistor and an output of a feedback portion. In FIG. 15, a sense element 33 disposed on the front side of the substrate 10 is shown as a broken line.

The substrate 10 includes a main region 30, which corresponds to the region 30 in the above embodiments, and a sense region. The IGBT element and the FWD element are formed in the main region 30. The sense region has dimensions, which are smaller than those of the main region 30. The main region 30 may correspond to the region in FIGS. 1-13. The sense region includes a sense element 33, which flows current in proportion to the current in the FWD. Based on detection result of the sense element 33, feedback control is performed such that the driving signal is blocked to be input into the gate electrode 12 of the IGBT when the FWD functions. When the FWD does not function, the driving signal is input into the gate electrode 12.

In this embodiment, the sense region has the same structure as the main region 30. The area of the sense region is about one-thousandth of the area of the main region 30. Thus, the sense element 33 provides both of an IGBT sense element 33a and a FWD sense element 33b. The IGBT sense element 33a flows current in proportion to the current flowing through the IGBT. The FWD sense element 33b flows current in proportion to the current flowing though the FWD. A reference numeral 34 represents a pad for the sense element 33. A reference numeral 35 represents a cathode region of the sense element 33. The cathode region 35 is not arranged directly under a surface portion of the substrate 10, which is shown as the broken line in FIG. 15. The cathode region 35 is arranged at a position spaced apart from the surface portion of the substrate 10 by a predetermined distance along with a direction perpendicular to the thickness direction of the substrate 10. Thus, the collector region 18, which provides the IGBT element 30a and the sense element 33, is arranged on the backside of the substrate 10 directly under the sense element 33. The sense element 33 is disposed on the front side of the substrate 10. Thus, the reduction of output of the IGBT sense element 33a is restricted.

Next, a feedback circuit for a gate driving signal having the semiconductor device 100 will be explained. The feedback circuit is a part of an inverter circuit, i.e., the feedback circuit is one of upper and lower arms in the inverter circuit. A general feedback circuit is disclosed in JP Application No. 2007-229959 and JP Application No. 2007-268328.

As shown in FIG. 16, the feedback circuit includes the semiconductor device 100 in FIGS. 14 and 15, an AND circuit 101, a sense resistor 102 and a feedback element 103.

The AND circuit 101 is a logic circuit for outputting a high level signal when all signals input into the AND circuit 101 is in a high level. A PWM gate signal is input into the AND circuit 101 from an external circuit in order to drive the semiconductor device 100, i.e., to operate the IGBT element 30a and the IGBT sense element 33a. Here, the PWM gate signal corresponds to the driving signal. Further, an output of the feedback element 103 is input into the AND circuit 101. The PWM gate signal is generated by a PWM signal generator circuit as the external circuit. The gate signal is input into an input terminal of the AND circuit 101. The AND circuit 101 and the feedback element 103 provide a feedback means.

The AND circuit 101 is electrically coupled with the gate pad 32 in the device 100 via the gate resistor 104. Control of the gate voltage in the IGBT element 30a and the IGBT sense element 33a is performed by the PWM gate signal input from the AND circuit 101 via the gate resistor 104. For example, when the PWM gate signal passing through the AND circuit 101 is a high level signal, the IGBT element 30a turns on so that the device 100 starts to operate. When the PWM gate signal is a low level signal, the IGBT element 30a turns off so that the device 100 stops to operate. When the AND circuit 101 stops to pass the PWM gate signal therethrough, i.e., when the input of the PWM gate signal into the gate electrode 12 is forbidden, the IGBT element 30a and the IGBT sense element 33a are not driven.

A collector of the IGBT element 30a is coupled with a load and a power source, which are not shown in FIG. 16. A main current flows between the collector and the emitter in the IGBT element 30a. The collector electrode of the IGBT sense element 33a and the collector electrode 20 of the IGBT element 30a are common. The emitter region of the IGBT sense element 33a is coupled with one end of the sense resistor 102 via the sense pad 34. The other end of the sense resistor 102 is coupled with the emitter region 15 of the IGBT element 30a, i.e., coupled with the emitter electrode 17 of the IGBT element 30a, which corresponds to, for example, the emitter electrode 17 in FIG. 3. Thus, a sense current for detecting current flows from the emitter region of the IGBT sense element 33a. The sense current is proportional to the main current flowing through the IGBT element 30a. The sense current flows through the sense resistor 102. The potential difference Vs between both ends of the sense resistor 102 feeds back to the feedback element 103.

The feedback element 103 is formed from a combination of operation amplifiers and the like. The feedback element 103 determines whether current flows through the FWD element 30b and whether excess current flows through the IGBT element 30a. Based on the determination result of the feedback element 103, the feedback element 103 permits or forbids to pass the PWM gate signal, which is input into the AND circuit 101. Thus, the feedback element 103 has a diode current detection threshold Vth1 and an excess current detection threshold Vth2. The diode current detection threshold Vth1 is used for determining whether the current flows through the FWD element 30b. The excess current detection threshold Vth2 is used for determining whether the excess current flows through the IGBT element 30a. The diode current detection threshold Vth1 and the excess current detection threshold Vth2 are predetermined voltages.

When the IGBT element 30a functions normally, i.e., when the current does not flow through the FWD element 30b, the current flows from the IGBT sense element 33a to the sense resistor 102. Thus, when the electric potential of the emitter region 15 in the IGBT element 30a provides a reference potential, the potential difference Vs between both ends of the sense resistor 102 is positive. On the other hand, when the current flows through the FWD element 30b, the current flows from the sense resistor 102 to the FWD sense element 33b. Thus, when the potential of the emitter region 15 of the IGBT element 30a provides the reference potential, the potential difference Vs between both ends of the sense resistor 102 is negative. Accordingly, the diode current detection threshold Vth1 is set to be negative. When the excess current flows through the IGBT element 28, the sense current flowing from the IGBT sense element 33a to the sense resistor 102 becomes large. Thus, the potential difference Vs between both ends of the sense resistor 102 is positive and large. Accordingly, the excess current detection threshold Vth2 is set to be positive.

When the IGBT element 30a is driven, the feedback element 103 permits to pass the PWM gate signal to be input into the AND circuit 101, so that the feedback element 103 outputs a permission signal. Further, as shown in FIG. 17, when the potential difference Vs is smaller than the diode current detection threshold Vth1, or when the potential difference Vs is larger than the current detection threshold Vth2, the feedback element 103 forbids to pass the PWM gate signal to be input into the AND circuit 101, so that the feedback element 103 outputs a forbidden signal.

For example, in a normal condition, the PWM gate signal as a driving signal for operating the IGBT element 30a and the IGBT sense element 33a is generated at the PWM signal generator circuit as an external circuit. Then, the PWM gate signal is input into the AND circuit 101. When the FWD element 30b turns off, so that the current does not flow through the FWD sense element 33b. Accordingly, the potential of one end of the sense resistor 102, which is connected to the emitter region of the IGBT sense element 33a is higher than the potential of the other end of the sense resistor 102, which is connected to the emitter region 15 of the IGBT element 30a. Thus, the potential difference between both ends of the sense resistor 102 becomes positive. Here, the one end of the sense resistor 102 is connected to the sense pad 34 of the IGBT sense element 33a, and the other end of the sense resistor 102 is connected to the emitter electrode 17 of the IGBT element 30a.

As shown in FIG. 17, since the potential difference Vs is larger than the diode current detection threshold Vth1, the feedback element 103 determines that the current does not flow through the FWD element 30b. In this case, the output of the feedback element 103 is in a high level, as shown in FIG. 17. The high level signal is input into the AND circuit 101. When the high level PWME gate signal and the output of the feedback element 103 are input into the AND circuit 101, the PWM gate signal passes through the AND circuit 101. Then, the PWM gate signal is input into the gate electrode of both of the IGBT element 30a and the IGBT sense element 33a via the gate resistor 104. Thus, the IGBT element 30a and the IGBT sense element 33a turn on, so that the IGBT element 30a and the IGBT sense element 33a'are operated. The current flows through the load (not shown) connecting to the collector electrode 20 of the IGBT element 30a or the emitter electrode 17 of the IGBT element 30a.

When the current flows through the FWD element 30b, the potential of one end of the sense resistor 102, which is connected to the anode region of the FWD element 30b, i.e., the emitter electrode 17, becomes higher than the potential of the other end of the sense resistor 102, which is connected to the anode region of the FWD sense element 33b, i.e., the sense pad 34. Thus, the potential difference between both ends of the sense resistor 102 is negative.

Thus, as shown in FIG. 17, when the potential difference Vs is smaller than the diode current detection threshold Vth1, the feedback element 103 determines that the current flows through the FWD element 30b. Thus, the feedback element 103 outputs the forbidden signal so that the PWM gate signal is forbidden to pass the AND circuit 101. The forbidden signal is input into the AND circuit 101.

Accordingly, since the driving signal is not input into the IGBT element 30a from the AND circuit 101, the IGBT element 30a stops to operate. The gate signal becomes zero. Thus, when the FWD element 30b operates in a forward direction, the IGBT element 30a does not function.

When the excess current flows through the IGBT element 30a, the sense current flowing from the IGBT sense element 33a to the sense resistor 102 increases in proportion to the excess current. Thus, the potential difference Vs becomes higher than that in a case where the IGBT element 30a functions normally.

Accordingly, when the potential difference Vs is larger than the current detection threshold Vth2, the feedback element 103 determines that the excess current flows through the IGBT element 30a. The feedback element 103 outputs the forbidden signal for the PWM gate signal to be input into the AND circuit 101 so that the PWM gate signal is forbidden to pass through the AND circuit 101. The forbidden signal is input into the AND circuit 101.

Thus, since the driving signal for driving the IGBT element 30a is not input from the AND circuit 101, the IGBT element 30a stops to operate. Thus, the excess current does not break down the IGBT element 30a.

In this embodiment, the device 100 includes the sense element 33, i.e., the FWD sense element 33b flowing the current therethrough in proportion to the current in the FWD element 30b. The device 100 performs feedback control as follows. Based on the detection result of the sense element 33, the input of the driving signal into the gate electrode 12 of the IGBT element 30a is stopped during the operation of the FWD element 30b. The driving signal is input into the gate electrode when the FWD element 30b does not function. The main region 30 in the substrate 10 is one of the regions shown in FIGS. 1-13. Specifically, in the main region 30, the cathode side second region 14b over the cathode region 19 is coupled with the emitter electrode 17. The first region 13 and the cathode side second region 14b function as the anode region of the FWD element 30b. Further, there is no high impurity concentration region such as the emitter region 15 in the second region 14b. Thus, the FWD element 30b is not affected by the influence of the gate electrode 12 when the FWD element functions in the forward direction.

Figure 18:
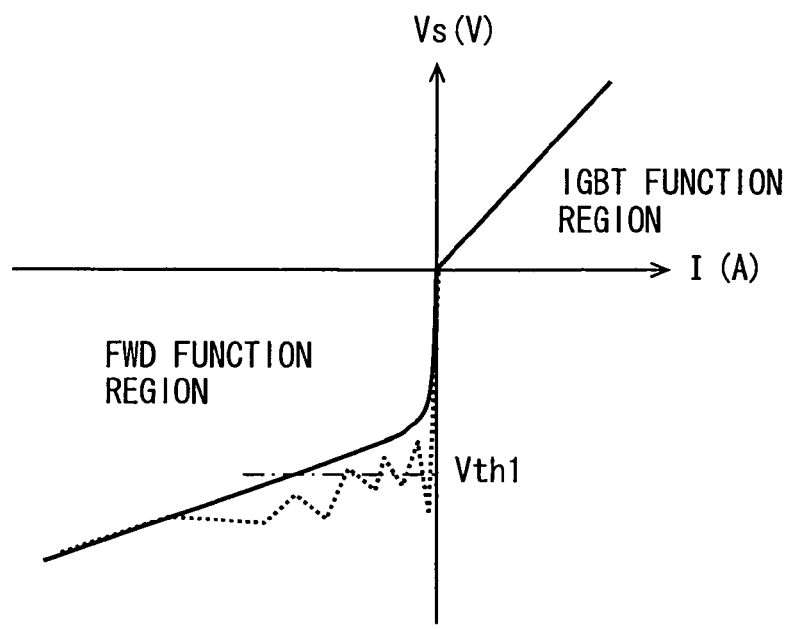
FIG. 18 is a graph showing a relationship between a current flowing through the FWD and the potential difference Vs.

The above effect will be explained as follows. FIG. 18 shows a relationship between the current flowing through the FWD element and the potential difference Vs. The horizontal axis in FIG. 18 represents the current flowing through the FWD element. Specifically, the current in the horizontal axis in FIG. 18 corresponds to the current flowing along with the thickness direction of the substrate 10. In FIG. 18, the direction from the backside to the front side of the substrate 10 provides positive. Thus, the current I includes not only the current flowing through the FWD element 30b but also the collector current of the IGBT element 30a. A broken line in FIG. 18 shows a relationship as a comparison in a case where the FWD element is affected by the influence of the gate potential largely. For example, the comparison case is such that the cathode side second region 14b over the cathode region 19 and the collector side second region 14a over the collector region 18 in FIG. 3 have a floating potential. Alternatively, the emitter region 15 is formed in a surface portion of a whole of the base layer 11, which is capable of functioning as the anode region of the FWD element.

As shown in FIG. 18, in a IGBT function region, in which the current I flowing through the substrate 10 and the potential difference Vs are positive, the current I is in proportion to the potential difference Vs. In a FWD function region, in which the current I flowing through the substrate 10 and the potential difference Vs are negative, the broken line as a comparison result has weak linearity. Specifically, the current waveform of the broken line is largely deviated from a straight line. Specifically, in a part of the FWD function region, the potential difference Vs largely varies with respect to the current I, and the increase and decrease of the potential difference Vs alternately occur. This is because the FWD element is much affected by the influence of the gate potential. On the other hand, in this embodiment, since the influence of the gate potential on the FWD element 30b is small, the deviation of the current waveform from the straight line is smaller than the comparison result. Thus, the linearity of the solid line is improved. Further, the potential difference Vs increases largely in the part of the FWD function region, in which the linearity of the broken line of the comparison result is damaged.

Since the sense element 33, i.e., the FWD sense element 33b, flows the current, which is in proportion to the current flowing through the FWD element 30b, the influence of the gate potential on the FWD element 30b is reflected on the sense element 33, i.e., the FWD sense element 33b. Accordingly, in the present embodiment, the variation of the detection result of the FWD sense element 33b is reduced. Thus, the feedback control, i.e., input control of the driving signal to the gate electrode 12 is performed with high accuracy. The forward voltage Vf of the FWD element 30b is effectively reduced.

Thus, it is preferable to use the main region 30 in the device 100 for the feedback control with the FWD sense element 33b, i.e., the sense element 33.

Figure 19:
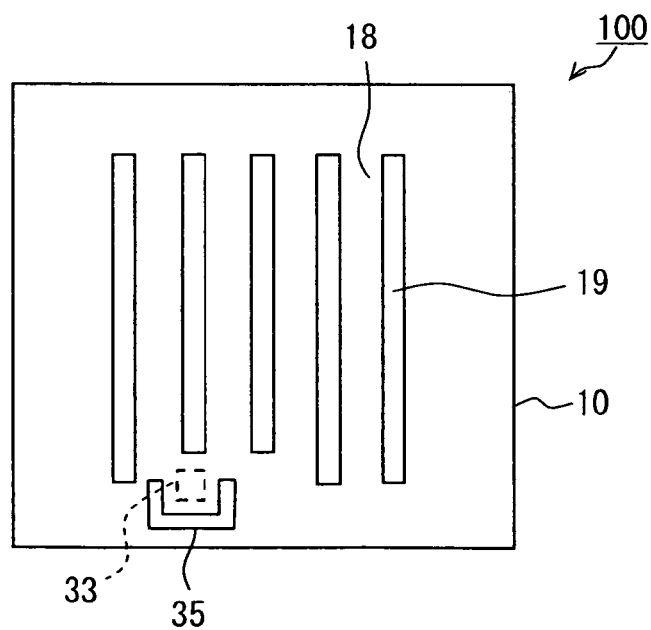
FIG. 19 is a diagram showing a plan view of a backside of a semiconductor device according to a modification of the ninth embodiment.

In this embodiment, the cathode region 35 for providing the sense element 33, i.e., the FWD sense element 33b, faces one side of the sense element 33 having a rectangular shape on the plan view. Alternatively, the cathode region 35 may be formed such that the cathode region 35 faces multiple sides of the sense element 33 by a predetermined distance. Specifically, the cathode region 35 is spaced apart from multiple sides of the rectangular shape of the sense element 33 along with a direction perpendicular to the thickness direction of the substrate 10. In this case, the output of the FWD sense element 33b is improved. For example, as shown in FIG. 19, the cathode region 35 has a C shape so that the cathode region 35 faces three sides of the sense element 33.

Figure 20:
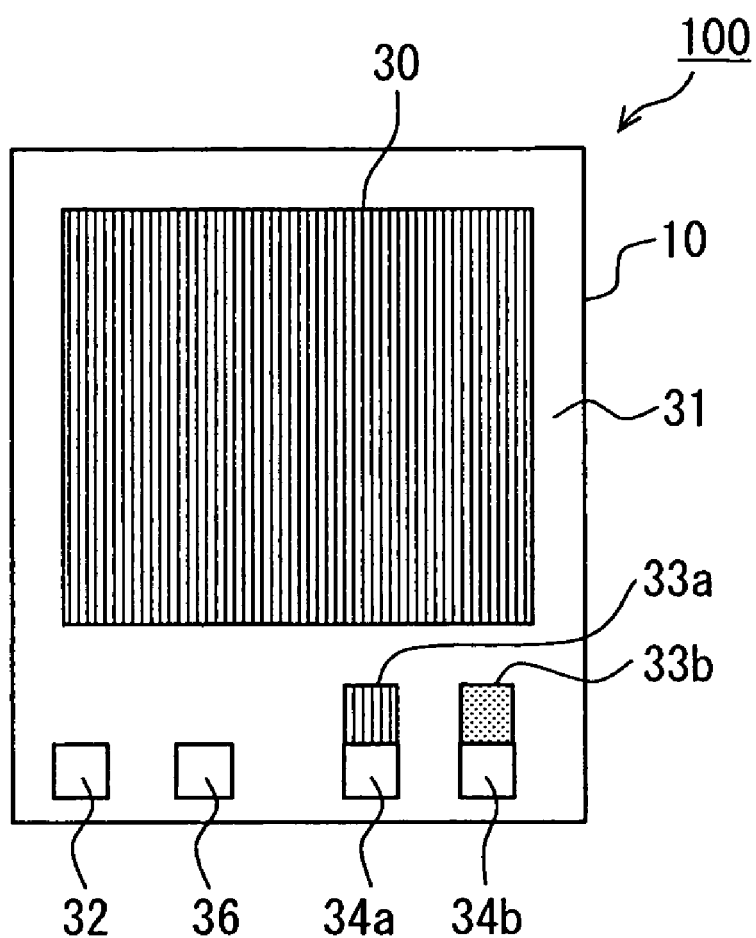
FIG. 20 is a diagram showing a plan view of a front side of a semiconductor device according to the modification of the ninth embodiment.

In the sense region of the substrate 10, one sense element 33 provides both of the IGBT sense element 33a and the FWD sense element 33b. Alternatively, the IGBT sense element 33a and the FWD sense element 33b may be separately formed in the substrate 10, as shown in FIG. 20. In this case, the IGBT sense element 33a and the FWD sense element 33b may be connected to different sense resistors, respectively. A reference numeral 34a represents the IGBT sense pad, and a reference numeral 34b represents the FWD sense pad, and a reference numeral 36 represents an emitter sense pad.

In this embodiment, the sense element 33 provides both of the IGBT sense element 33a and the FWD sense element 33b. Alternatively, the device 100 may includes at least one FWD sense element 33b as the sense element 33.

The sense resistor 102 is coupled with an emitter side of the IGBT sense element 33a and an anode side of the FWD sense element 33b. Alternatively, the sense resistor may be coupled with a collector side of the IGBT sense element 33a and a cathode side of the FWD sense element 33b.

Tenth Embodiment

Figure 21A:
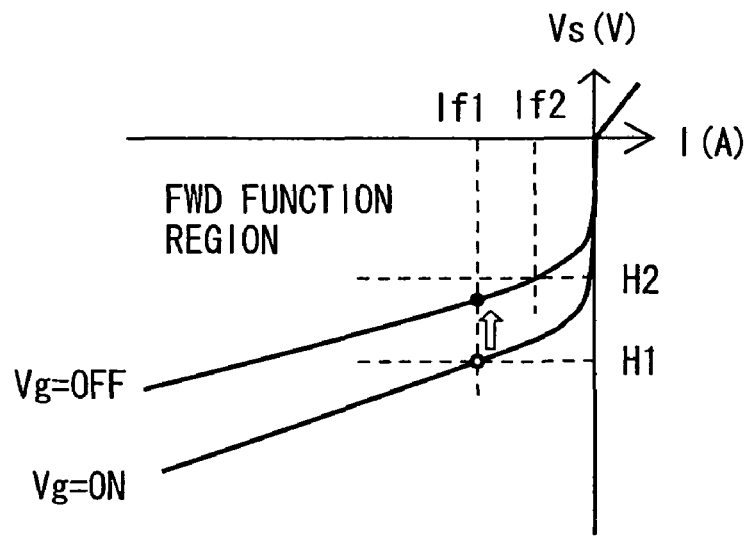
FIG. 21A is a graph showing a relationship between the potential difference Vs and the current flowing through the FWD according to a tenth embodiment.
Figure 21B:
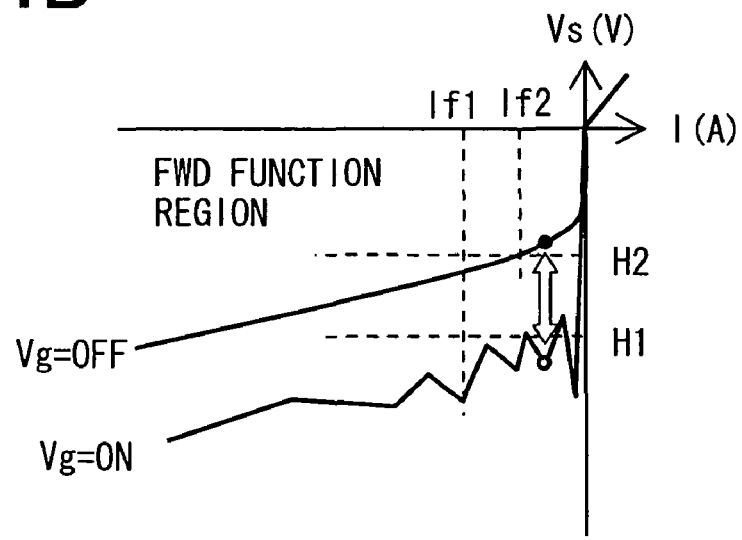
FIG. 21B is a graph showing a relationship between the potential difference Vs and the current flowing through the FWD according to a comparison.
Figure 22:
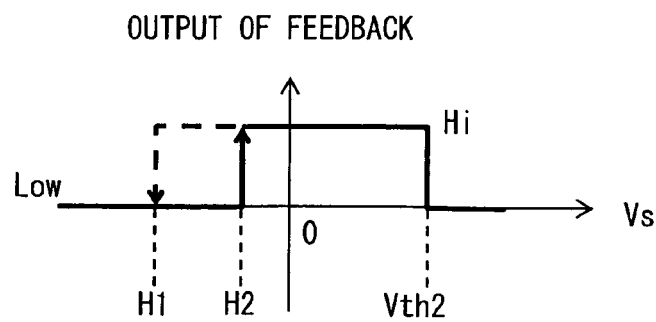
FIG. 22 is a graph showing a relationship between the potential difference Vs and an output of the feedback portion.

FIG. 21A shows a relationship between the potential difference Vs and the current flowing through the FWD element according to a tenth embodiment. FIG. 21B shows the relationship according to a comparison. FIG. 22 shows a relationship between the potential difference Vs and the output of the feedback element.

As shown in FIG. 21A, the current I flowing through the substrate 10 is in proportion to the potential difference Vs when the current I and the potential difference Vs are positive. When the current I is negative, i.e., when the FWD element 30b functions, the potential difference Vs with respect to the current I in a case where the IGBT element 30a turns on (i.e., Vg=ON) is different from that in a case where the IGBT element turns off (i.e., Vg=OFF). Thus, the current waveform is varied according to the gate potential Vg.

Specifically, when the current flows through the FWD element 30b, and the IGBT element 30a turns on (i.e., Vg=ON in FIG. 21A), the current flows from the IGBT sense element 33a into the sense resistor 102. Thus, the potential difference Vs between both ends of the sense resistor 102 becomes small (i.e., an absolute value of the potential difference Vs becomes large). On the other hand, when the current flows through the FWD element 30b, and the IGBT element 30a turns off (i.e., Vg=OFF in FIG. 21A), the current in accordance with the current flowing through the FWD element 30b flows through the sense resistor 102. Thus, the potential difference Vs becomes larger than a case where the IGBT turns on (i.e., an absolute value of the potential difference Vs becomes small).

In the devices shown in FIGS. 1-13, as shown in FIG. 18, the potential difference Vs becomes large when the IGBT element 30a turns on, and the potential difference Vs becomes small when the IGBT element 30a turns off. However, it is difficult to equalize the potential difference Vs since the potential difference Vs is affected by the influence of gate interference.

In the present embodiment, to perform input state control (i.e., feedback control) of the driving signal for the gate electrode 12 with high accuracy, the device has two diode current detection thresholds H1, H2. For example, the feedback element 103 stores two diode current detections H1, H2.

The feedback element 103 has a first diode current detection threshold H1 (i.e., the first threshold) based on characteristics in the FWD operating region shown in FIG. 21A. The first threshold corresponds to the potential difference Vs when the current flowing through the FWD element 30b is a first current M. Further, the feedback element 103 has a second diode current detection threshold H2 (i.e., the second threshold), which is larger than the first threshold H1. The second threshold H2 corresponds to the potential difference Vs when the current flowing through the FWD element 30b is a second current If2, which is larger than the first current If1. Here, an absolute value of the second current If2 is smaller than an absolute value of the first current if1.

The first and second thresholds H1, H2 are set as follows. First, the relationship between the current I and the potential difference Vs shown in FIG. 21A is measured and obtained. Then, the first current If1 is determined based on the relationship in FIG. 21A. Then, the second current If2 is determined to be larger than the first current If1. The first and second currents If1, If2 are about 10% of a rated current, so that the first and second currents If1, If2 are near a lower limit in an ordinary operation region. When the IGBT element turns on, i.e., when Vg=ON, the potential difference Vs with respect to the first current If1 is set to be the first threshold H1. When the IGBT element turns off (i.e., Vg=OFF), the potential difference Vs with respect to the second current If2 is set to be the second threshold H2. Thus, the first and second thresholds H1, H2 are set in the feedback element 103.

Specifically, the feedback element 103 compares the potential difference Vs between both ends of the sense resistor 102 with the first and second thresholds H1, H2. As shown in FIG. 22, when the potential difference Vs is changed to a negative side, or when the potential difference Vs is reduced or changed toward the negative side, the feedback element 103 compares the potential difference Vs with the first threshold H1, so that the feedback element 103 determines whether operation of the IGBT element 30a is permitted. When the potential difference Vs is larger than the first threshold H1, the feedback element 103 permits to pass the PWM gate signal through the AND circuit 101, the signal input into the AND circuit 101 from the external circuit. Thus, the feedback element 103 permits the operation of the IGBT element 30a. When the potential difference Vs is smaller than the first threshold H1, the feedback element 103 does not permit to pass the PWM gate signal through the AND circuit 101, the signal input into the AND circuit 101 from the external circuit. Thus, the feedback element 103 forbids to pass the signal, so that the feedback element 103 stops driving the IGBT element 30a.

When the potential difference Vs is changed to a positive side, i.e., when the potential difference Vs increases or is changed toward the positive side, the feedback element 102 compared the potential difference Vs with the second threshold H2, so that the feedback element 103 determines whether operation of the IGBT element 30a is permitted. When the potential difference Vs is larger than the second threshold H2, the feedback element 103 permits to pass the PWM gate signal through the AND circuit 101, the signal input into the AND circuit 101 from the external circuit. Thus, the feedback element 103 permits the operation of the IGBT element 30a. When the potential difference Vs is smaller than the second threshold H2, the feedback element 103 does not permit to pass the PWM gate signal through the AND circuit 101, the signal input into the AND circuit 101 from the external circuit. Thus, the feedback element 103 forbids to pass the signal, so that the feedback element 103 stops driving the IGBT element 30a.

The feedback element 103 controls the pass of the PWM gate signal in the AND circuit 101 according to the change direction of the gate potential Vg in the IGBT element 30a with a hysteresis characteristic, as shown in FIG. 22. When the potential difference Vs is larger than the excess current detection threshold Vth2, the feedback element 103 forbids to pass the PWM gate signal to be input into the AND circuit 101 so that the feedback element 103 protects the IGBT element 30a from being damaged by the excess current similar to the ninth embodiment.

As shown in FIG. 22, when the potential difference Vs is changed toward the negative side, and the potential difference Vs falls below the first threshold H1, the output of the feedback element 103 becomes a low signal. Thus, the IGBT element 30a turns off. As shown in FIG. 21A, the potential difference Vs has the characteristics shown as "Vg=OFF," and the potential difference Vs becomes large, i.e., the absolute value of the potential difference becomes small. The potential difference Vs becomes a value, which is a cross point between the first current If1 corresponding to the first threshold H1 and the current waveform of "Vg=OFF." Specifically, the potential difference Vs becomes a black circle in FIG. 21A. This value is in a range between the second threshold H2 and the first threshold H1, and does not exceed the second threshold H2. Accordingly, the IGBT element 30a does not turn on again, and the IGBT element 30a maintains to be in an off state. Thus, oscillation of the IGBT element 30a, in which the IGBT element 30a repeats to turn on and off, is prevented.

The above condition is the same as a case where the IGBT element 30a switches from the off state to the on state. As shown in FIG. 22, when the potential difference Vs is changed toward the positive side, and the potential difference Vs exceeds the second threshold H2, the output of the feedback element 103 becomes a high level so that the IGBT element 30a turns on. Thus, as shown in FIG. 21A, the potential difference Vs has the characteristics of "Vg=ON." The potential difference Vs becomes small, i.e., the absolute value of the potential difference Vs becomes large. However, the potential difference Vs does not fall below the first threshold H1. Thus, as shown in FIG. 21A, the output of the feedback element 103 does not become a low level since the potential difference Vs with respect to the second current If2 does not fall below the first threshold H1. Thus, the IGBT element 30a maintains to be in the on-state.

By using two thresholds H1, H2, oscillation, i.e., malfunction of the gate of the IGBT element 30a is prevented. When the gate of the IGBT element 30a is oscillated, the IGBT element 30a repeats to turn on and off.

In this embodiment, similar to the ninth embodiment, the main region 30 is the same as the devices in FIGS. 1-13. The influence of the gate potential on the FWD element 30b is small. Thus, as shown in FIG. 21A, in the operation region of the FWD element 30b, the linearity of the current waveform in the on-state of the IGBT element 30a (i.e., the curve shown as "Vg=ON") is improved. Accordingly, the first and second currents If1, If2 can be set in a range of a normal operation region of the FWD element 30b. Specifically, the first and second currents If1, If2 can be set near the lower limit. Here, the range of a normal operation region of the FWD element 30b is a range between 10% and 50% of a rated current.

In FIG. 21B as a comparison, similar to the comparison result in FIG. 18, in the main region 30, the FWD 30b is much affected by the influence of the gate potential. For example, the comparison device is obtained such that the cathode side second region 14b over the cathode region 19 together with the collector side second region 14a over the collector region 18 has the floating potential in FIG. 3. Specifically, the comparison device is prepared such that the emitter region 15 is formed in a surface portion of a whole of the base layer 11, which provides to function as the anode region of the FWD element. As shown in FIG. 21B, in the operation region of the FWD element 30b, the current waveform in the on-state of the IGBT element 30a (i.e., the current curve shown as "Vg=ON") is largely deviated from a straight line. This disturbance of the current waveform is generated in the normal operation region of the FWD element 30b. Accordingly, when the first and second currents If1, IQ are set to be the same values as the present embodiment, as shown in FIG. 21B, a part of the curve of "Vg=ON" falls below the first threshold H1, and further, a part of the curve of "Vg=OFF" exceeds the second threshold H2. Thus, although the two thresholds H1, H2 are set, the gate of the IGBT element 30a repeats to switch on and off.

To protect the IGBT element 30a from malfunction, it is considered that the currents If1, If2 are set to be smaller than the normal operation range so that the absolute value of the currents If1, If2 are larger than the normal operation range, or the currents If1, If2 are set to be larger than the normal operation range so that the absolute value of the currents If1, If2 are smaller than the normal operation range. However, when the currents If1, If2 are set to be smaller than the normal operation range, the absolute value of the currents If1, If2 in the rated current region are larger than the normal operation range, and therefore, the feedback control of the IGBT element 30a is not performed in the normal operation region. Thus, the forward direction loss increases. When the currents If1, If2 are set to be larger than the normal operation range, the currents If1, If2 are set around the OA, and therefore, the absolute value of the currents If1, If2 is small. Thus, the IGBT element 30a is easily affected by high frequency noise, so that it is difficult to design a circuit diagram of the device.

Thus, in the present embodiment, the oscillation of the gate of the IGBT element 30a is prevented, i.e., the malfunction of the gate of the IGBT element 30a in which the gate repeats to switch on and off is protected. Further, the increase of the forward voltage Vf of the FWD element is restricted, and the IGBT element 30a is not easily affected by the high frequency noise.

Figure 23:
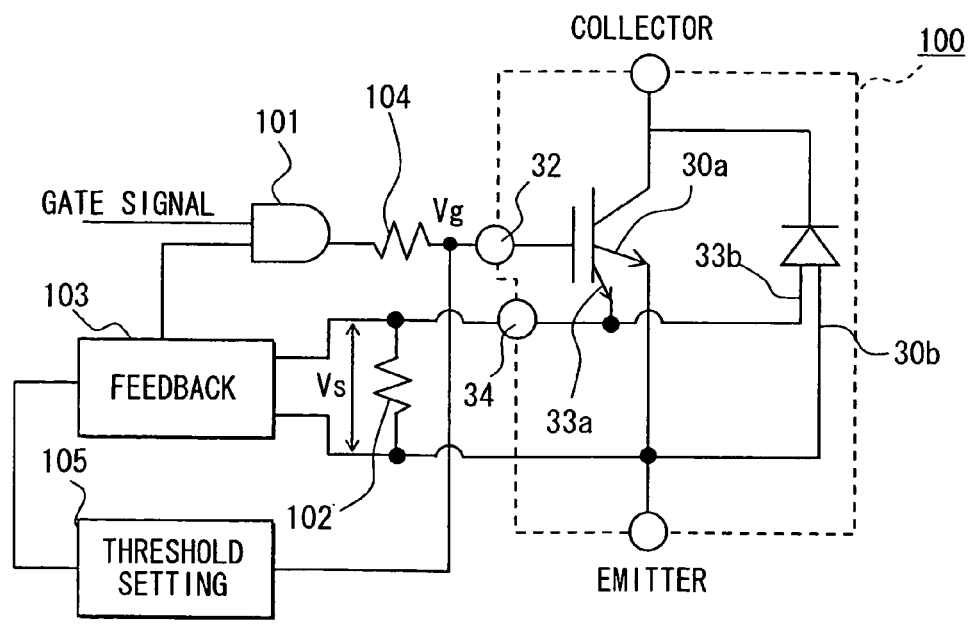
FIG. 23 is a circuit diagram showing a feedback circuit having the semiconductor device according to the tenth embodiment.

In this embodiment, the feedback element 103 has the first and second thresholds H1. H2. Alternatively, as shown in FIG. 23, the device may include a threshold setting element 105. The threshold setting element 105 compares the gate potential Vg with a third threshold H3, outputs the first threshold H1 to the feedback element 103 when the gate potential exceeds the third threshold H3, and outputs the second threshold H2 to the feedback element 103 when the gate potential does not exceed the third threshold H3. In this case, the feedback element 103 compares the first or second threshold H1, H2 with the potential difference Vs. FIG. 23 shows a modification of the feedback circuit including the semiconductor device 100.

In this embodiment, based on the first and second currents If1, If2, the first and second thresholds H1, H2 are set. Alternatively, after the relationship between the current I and the potential difference Vs is measured and obtained, the first and second thresholds H1, H2 may be set in such a manner that the potential difference Vs in case of "Vg=ON" is not smaller than the first threshold H1, and the potential difference Vs in case of "Vg=OFF" is not larger than the second threshold H2. Specifically, the potential difference Vs is in a range between the first and second thresholds H1, H2 even when the potential difference Vs decreases when Vg=ON, and increases when Vg=OFF.

In the above embodiments, the semiconductor device 100 includes the field stop layer 21. Alternatively, the IGBT element 30a and the IGBT sense element may be a punch through type IGBT or a non-punch through type IGBT.

The IGBT element 30a is a N channel IGBT so that the first conductive type is the N conductive type, and the second conductive type is the P conductive type. Alternatively, the IGBT element 30a may be a P channel IGBT so that the first conductive type is the P conductive type, and the second conductive type is the N conductive type.

Figure 24:
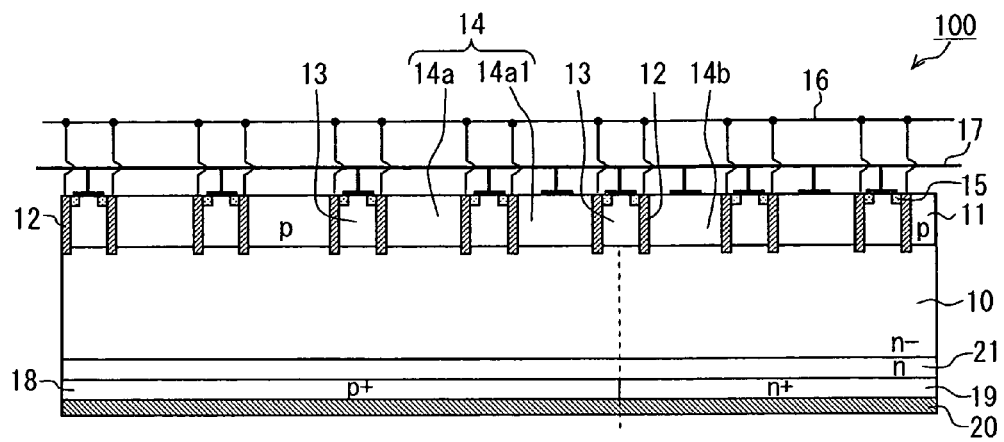
FIG. 24 is a diagram showing a cross sectional view of a semiconductor device according to other embodiments.
Figure 25:
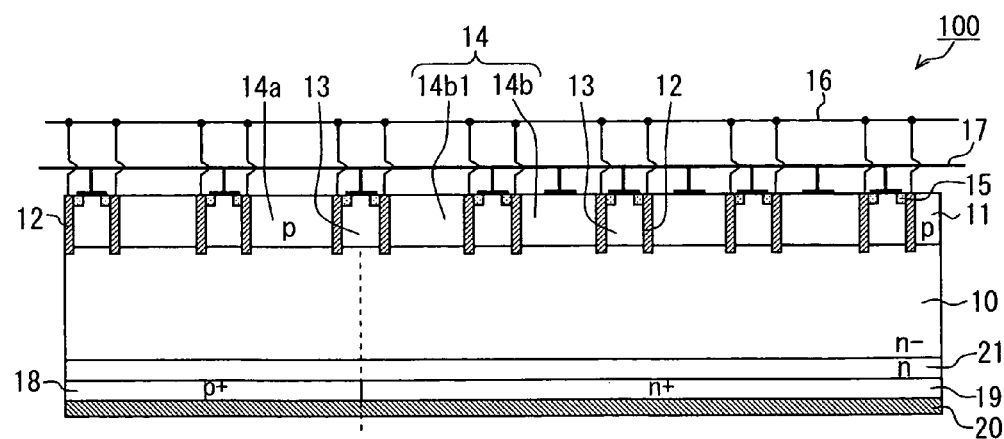
FIG. 25 is a diagram showing a cross sectional view of a semiconductor device according to other embodiments.

In the embodiments, the collector side second region 14a having the floating potential is formed in a whole of the second region 14 over the collector region 18. The cathode side second region 14b connecting to the emitter is formed in a whole of the second region 14 over the cathode region 19. Alternatively, multiple second regions 14 includes the collector side second regions 14a having the floating potential and the cathode side second regions 14b connecting to the emitter electrode 17, at least a part of the second region 14 over the cathode region 19 may be connected to the emitter electrode 17, and at least a part of the second region 14 over the collector region 18 may have the floating potential. For example, as shown in FIG. 24, only a part of the second region 14 arranged over the collector region 18 provides the collector side second region 14a1 connecting to the emitter electrode 17, and the other part of the second region 14 over the collector region 18 provides the collector side second region 14a having the floating potential. Specifically, in FIG. 24, only one collector side second region 14a1 adjacent to the interface between the collector region 18 and the cathode region 19 is connected to the emitter electrode 17. In FIG. 25, only a part of the second region 14 arranged over the cathode region 19 provides the cathode side second region 14b1 having the floating potential, and the other part of the second region 14 over the cathode region 19 provides the cathode side second region 14b connecting to the emitter electrode 17. Specifically, in FIG. 25, only one cathode side second region 14b1 adjacent to the interface between the collector region 18 and the cathode region 19 has the floating potential. FIGS. 24 and 25 provide modifications of the first embodiment.

As shown in FIG. 24, when the other part of the second region 14 over the collector region 18 provides the collector side second region 14a having the floating potential, the hole is not discharged to the emitter electrode 17 via the collector side second region 14a even when the driving signal is input into the gate electrode 12, and the channel is formed under the emitter region 15 in the first region 13. Thus, the hole is accumulated in the substrate 10. Thus, the on-state voltage of the IGBT element is reduced. Further, only the part of the second region over the collector region 18 and disposed in a certain distance from the interface between the cathode region 19 and the collector region 18 is connected to the emitter electrode 17. Thus, the current path of the FWD element is shortened, and the forward voltage Vf of the FWD element is reduced.

As shown in FIG. 25, when the other part of the second region 14 arranged over the cathode region 19 provides the cathode side second region 14b connecting to the emitter electrode 17, the other part of the second region 14 together with the first region 13 functions as the anode region of the FWD element. Thus, compared with a case where only the first region 13 functions as the anode region, the area of the region capable of functioning as the anode region of the FWD is larger. Further, since the other part of the second region 14 over the cathode region 19 is connected to the emitter electrode 17, and provides the anode region, and the distance between the other part and the cathode region 19 is shorter than the collector side second region 14a and the other part, the current path of the FWD element is shortened, compared with a case where the second region 14 over the collector region 18 provides the anode region. Accordingly, the forward voltage Vf of the FWD element is reduced. Further, only the part of the second region 14 over the cathode region 19 and disposed in a certain distance from the interface between the cathode region 19 and the collector region 18 has the floating potential. Thus, the current path of the IGBT element is shortened, and the on-state voltage Von of the IGBT element is reduced.

In FIG. 24, the other part of the second region 14 over the collector region 18 has the floating potential, the part of the second region 14 over the collector region 18 is connected to the emitter electrode 17, and a whole of the second region 14 over the cathode region 19 is connected to the emitter electrode 17. In FIG. 25, the other part of the second region 14 over the cathode region 19 is connected to the emitter electrode 17, the part of the second region 14 over the cathode region 19 has the floating potential; and a whole of the second region 14 over the collector region 18 has the floating potential. Alternatively, the second region 14 over the collector region 18 may include the collector side second region 14a having the floating potential and the collector side second region 14a1 connecting to the emitter electrode 17, and the second region 14 over the cathode region 19 may include the cathode side second region 14b connecting to the emitter electrode 17 and the cathode side second region 14b1 having the floating potential.

Figure 26:
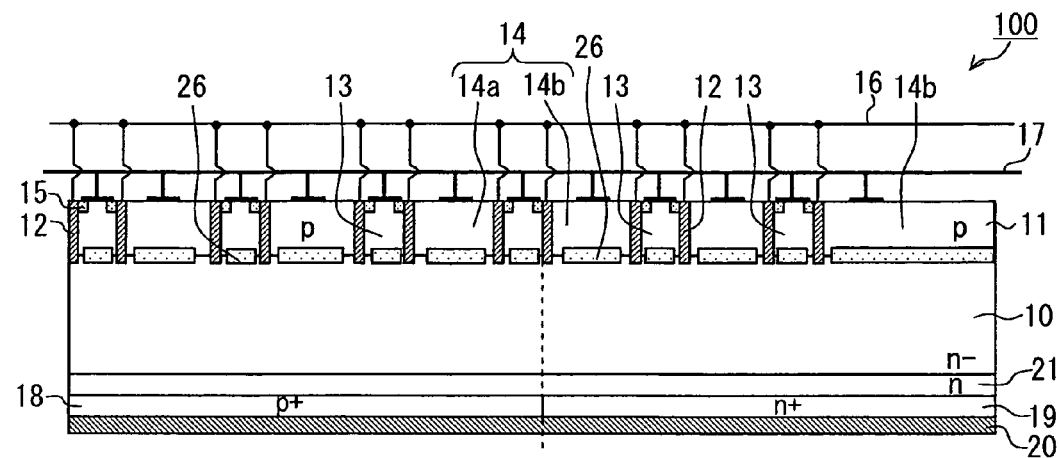
FIG. 26 is a diagram showing a cross sectional view of a semiconductor device according to other embodiments.

FIG. 26 shows a semiconductor device according to other embodiments. The device in FIG. 26 is similar to the device in FIG. 11. The difference is such that the collector side second region 14a over the collector region 18 in FIG. 26 is electrically coupled with the emitter electrode 17, and thereby, a mirror capacitance is reduced. Thus, the switching speed of a RC-IGBT (reverse conduction diode-IGBT) is improved.

Further, the N well as the N conductive type semiconductor layer 26 is arranged under the emitter region 15 and the base layer 11 as the P well. Thus, holes are prevented from discharging when the IGBT turns on. Accordingly, the on-state voltage Von and the forward voltage Vf are reduced with avoiding the influence of the potential in the gate electrode 12. Further, since the N conductive type semiconductor layer 26 does not contact the sidewall of the trench, the increase of the electric field near the trench is restricted, so that the breakdown voltage is improved.

Figure 27:
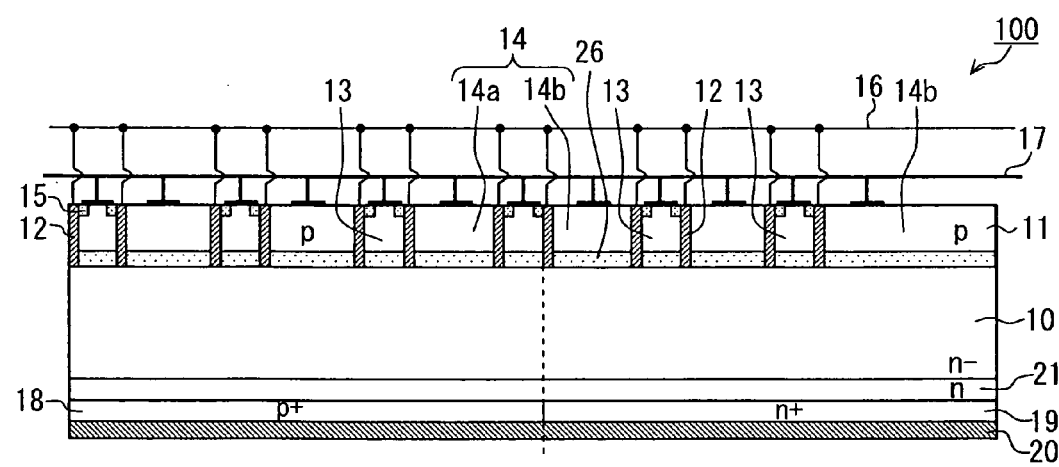
FIG. 27 is a diagram showing a cross sectional view of a semiconductor device according to other embodiments.

FIG. 27 shows a semiconductor device according to other embodiments. The device in FIG. 27 is similar to the device in FIG. 26. The difference is such that the N conductive type semiconductor layer 26 contacts the sidewall of the trench. Specifically, the N conductive type semiconductor layer 26 is arranged in a whole of an active region, which is disposed in the base layer 11. In this case, holes are prevented from being discharged to the base layer 11 via an interface between the trench and the N conductive type semiconductor layer 26. Thus, a mirror capacitance is small, and the carrier is accumulated effectively.

Figure 28:
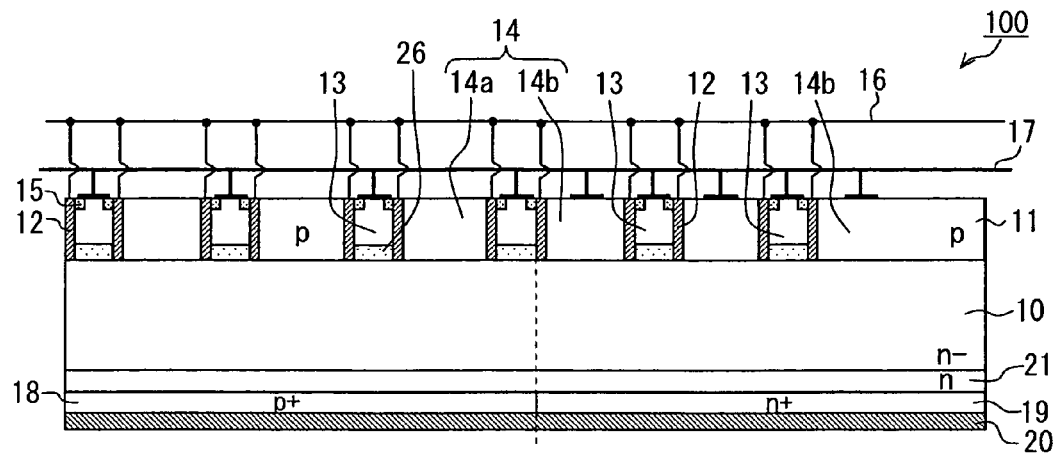
FIG. 28 is a diagram showing a cross sectional view of a semiconductor device according to other embodiments.

FIG. 28 shows a semiconductor device according to other embodiments. The device in FIG. 28 is similar to the device in FIG. 5. The difference is such that the N conductive type semiconductor layer 26 is arranged in a whole of the first region 13. Thus, the N conductive type semiconductor layer 26 provides the carrier accumulation effect, so that the on-state voltage is reduced.

Figure 29:
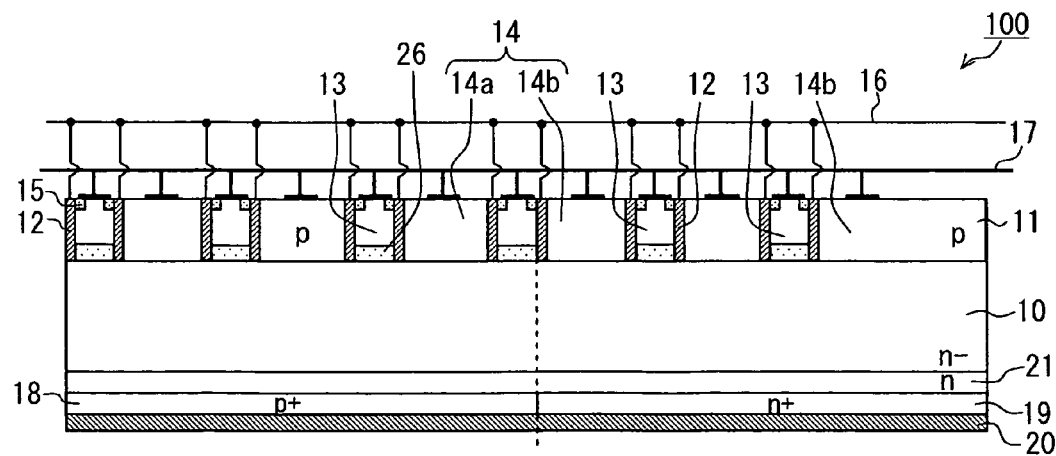
FIG. 29 is a diagram showing a cross sectional view of a semiconductor device according to other embodiments.

FIG. 29 shows a semiconductor device according to other embodiments. The device in FIG. 29 is similar to the device in FIG. 28. The difference is such that the collector side second region 14a over the collector region 18 in FIG. 29 is electrically coupled with the emitter electrode 17, and thereby, a mirror capacitance is reduced. Thus, the switching speed of a RC-IGBT (reverse conduction diode-IGBT) is improved.

Figure 30:
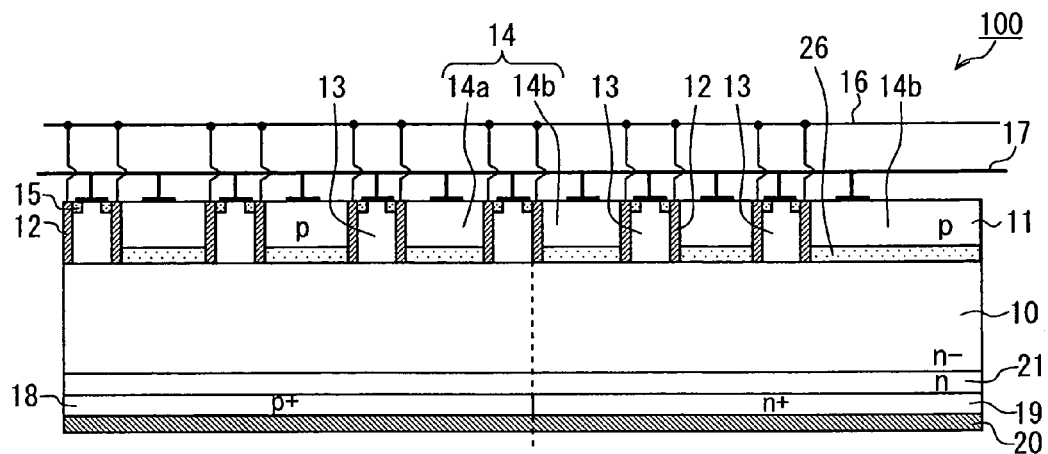
FIG. 30 is a diagram showing a cross sectional view of a semiconductor device according to other embodiments.

FIG. 30 shows a semiconductor device according to other embodiments. The device in FIG. 30 is similar to the device in FIG. 27. The difference is such that the N conductive type semiconductor layer 26 is only formed in the second region 14 including the collector side second regions 14a and cathode side second regions 14b. Thus, a mirror capacitance is reduced, and further, holes are prevented from discharging so that hole accumulation effect is maintained. Accordingly, the on-state voltage is reduced, and the switching loss is also reduced. Further, since the N conductive type semiconductor layer 26 is not formed in first region 13, so that break down voltage of a cell is prevented from being reduced, and a surge break down voltage is also prevented from being reduced.

Figure 31:
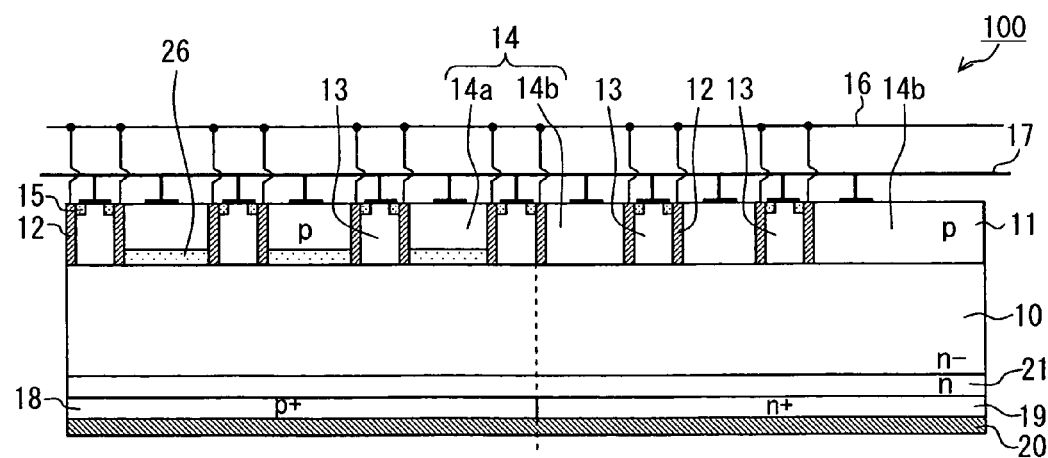
FIG. 31 is a diagram showing a cross sectional view of a semiconductor device according to other embodiments.

FIG. 31 shows a semiconductor device according to other embodiments. The device in FIG. 31 is similar to the device in FIG. 27. The difference is such that the N conductive type semiconductor layer 26 is only formed in the collector side second regions 14a. Thus, a mirror capacitance is reduced, and further, holes are prevented from discharging so that hole accumulation effect is maintained. Accordingly, the on-state voltage is reduced, and the switching loss is also reduced. Further, since the N conductive type semiconductor layer 26 is not formed in cathode side second regions 14b, the switching speed of the FWD is improved.

The above disclosure has the following aspects.

According to an aspect of the present disclosure, a semiconductor device includes: a semiconductor substrate having a first conductive type and including a first side and a second side; an IGBT element for flowing current in a thickness direction of the substrate, wherein the IGBT element is arranged in the substrate, the IGBT includes a collector region having a second conductive type, and the collector region is arranged in a surface portion of the second side of the substrate; a FWD element including a cathode region having the first conductive type, wherein the cathode region is arranged in another surface portion of the second side of the substrate in such a manner that the cathode region is adjacent to the collector region along with a parallel direction of the substrate; a base layer having the second conductive type and arranged on the first side of the substrate; a plurality of trench gate structures, each of which includes a trench on the first side of the substrate and a conductive film in the trench via an insulation film. The base layer is divided by the trench gate structures into a plurality of first and second regions. The trench gate structures include a gate electrode in the IGBT element. Each first region includes an emitter region in the IGBT element. Each emitter region is arranged in a surface portion of the first region, contacts the gate electrode, has the first conductive type, and has an impurity concentration higher than the substrate. Each second region does not include the emitter region. Each first region together with the emitter region is electrically coupled with an emitter electrode in the IGBT. The first regions include a collector side first region and a cathode side first region. The collector side first region is disposed over the collector region, and the cathode side first region is disposed over the cathode region. The second regions include a collector side second region and a cathode side second region. The collector side second region is disposed over the collector region, and the cathode side second region is disposed over the cathode region. At least a part of the cathode side second region is electrically coupled with the emitter electrode. At least a part of the collector side second region has a floating potential.

In the above device, multiple first regions over the collector region and the cathode region function as a channel of the IGBT element and an anode of the FWD element. Thus, a part of the FWD element is built in the IGBT element. Thus, when the on-state voltage of the IGBT is set to be a predetermined voltage, dimensions of the device are reduced.

Further, the part of the cathode side second region is electrically coupled with the emitter electrode. Thus, the part of the cathode side second region together with the first regions function as an anode of the FWD element. Thus, the area for functioning the anode becomes large. Further, current path of the FWD is shortened. Furthermore, since the emitter region of the IGBT does not exist in the second region, even when the driving signal is input into the gate electrode, the second region and the substrate do not have the same potential. Thus, the second region is not affected by the influence of the gate electrode. Accordingly, the forward voltage of the FWD is reduced.

Further, since the part of the collector side second region has a floating potential, even when the driving signal is input into the gate electrode so that the channel is formed under the emitter region in the first region, holes are not retrieved to the emitter electrode via the second region. Therefore, the hole is accumulated in the substrate. Since the first regions are disposed not only over the cathode region but also over the collector region, the area of the IGBT element becomes large. Accordingly, the on-state voltage of the IGBT element is reduced.

Alternatively, the semiconductor device may further include: a sense element for flowing current therethrough; and a feedback circuit. The substrate further includes a main region and a sense region. The IGBT element and the FWD element are arranged in the main region. The sense region has an area, which is smaller than the main region. The current flowing through the sense element is in proportion to current flowing through the FWD diode. The sense element is arranged in the sense region. The feedback circuit determines based on a detection result of the sense element whether the FWD element is in an operation state or a non-operation state. The feedback circuit blocks input of a driving signal to the gate electrode when the FWD element is in the operation state. The feedback circuit passes the input of the driving signal to the gate electrode when the FWD element is in the non-operation state. In this case, when the FWD functions, the IGBT does not function, so that the forward voltage of the FWD element is reduced.

In the main region, the part of the second region over the cathode region is electrically coupled with the emitter electrode, and thereby, the part of the second region together with the first regions function as the anode of the FWD element. Further, no high impurity region such as the emitter region exists in the second region, so that the FWD element is not affected by the influence of the gate potential when the FWD function in the forward direction. The influence of the gate potential on the FWD element is reflected on the sense element. In the present case, since the influence of the gate potential on the FWD element is small, variation of the detection result of the sense element is reduced. Accordingly, the feedback control of the driving signal inputting to the gate electrode is accurately controlled. Thus, the forward voltage of the FWD element is effectively reduced.

Alternatively, the semiconductor device may further include: a sense resistor coupled with the sense element. The feedback circuit has a first threshold and a second threshold, which are used for determining whether current flows through the FWD element. The first threshold corresponds to a potential difference between both ends of the sense resistor when the IGBT element is in an on-state, and current flowing through the substrate is a predetermined first current. The second threshold corresponds to the potential difference between both ends of the sense resistor when the IGBT element is in an off-state, and the current flowing through the substrate is a predetermined second current. The second current is larger than the first current, and the second threshold is larger than the first threshold. The feedback circuit compares the potential difference between both ends of the sense resistor and the first or second threshold. The feedback circuit passes the input of the driving signal to the gate electrode until the potential difference between both ends of the sense resistor falls below the first threshold, and the feedback circuit blocks the input of the driving signal to the gate electrode until the potential difference between both ends of the sense resistor exceeds the second threshold. Here, the first and second thresholds may be negative. In this case, when the potential difference is reduced from a positive side to a negative side, and falls below the first threshold, the input of the driving signal into the gate electrode is prohibited. This input block provides to turn off the IGBT element. Although the potential difference is large, the potential difference does not exceed the second threshold, and thereby, the IGBT element does not turn on again. When the potential difference increases from the negative side to the positive side, the input of the driving signal into the gate electrode is permitted. This permission of the input provides to turn on the IGBT element. Although the potential difference becomes small, the potential difference does not fall below the first threshold. Thus, the IGBT element does nit turn off again. Thus, the repeat of the turning on and off of the IGBT element is restricted. Since the main region has the above structure, and the influence of the gate potential on the FWD element is small, linearity of the current waveform of the IGBT element in the on-state is improved when the FWD element functions. Thus, the variation of the detection result of the sense element is reduced. Accordingly, the first and second currents are set to be in a normal operation range. The increase of the forward voltage of the FWD element is restricted. Further, influence of high frequency noise is reduced, compared with a case where the first and second currents are set to be out of the normal operation range.

Alternatively, a whole part of the cathode side second region may be electrically coupled with the emitter electrode, and a whole part of the collector side second region may have a floating potential. In this case, the area for functioning as the anode of the FWD element becomes large. Further, holes are not retrieved to the emitter electrode via the second region over the collector region. Thus, the on-state voltage of the IGBT element is much reduced.

Alternatively, all of the trench gate structures may provide the gate electrode in the IGBT element. The gate electrode includes a plurality of cathode side gate electrodes, which is disposed in a part of the base layer over the cathode region. The part of the base layer is disposed within a predetermined range from an interface between the cathode region and the collector region, and a residual part of the base layer over the cathode region provides the cathode side second region, which is electrically coupled with the emitter electrode. In this case, the area for functioning as the anode becomes large, so that the forward voltage of the FWD element is much reduced. Further, the area of the second region that is not affected by the influence of the gate potential increases. Thus, when the IGBT element turns on during the operation of the FWD element, the increase of the forward voltage of the FWD element is restricted. Thus, the forward voltage of the FWD element is much reduced. Further, since the first region is arranged near the collector region, the on-state voltage of the IGBT element is reduced.

Alternatively, the gate electrode may include a plurality of cathode side gate electrodes, which is disposed in a part of the base layer over the cathode region. The part of the base layer is disposed within a predetermined range from an interface between the cathode region and the collector region, and the gate electrode further includes a plurality of cathode side dummy gate electrodes, which is disposed in a residual part of the base layer over the cathode region. The cathode side dummy gate electrodes and the cathode side gate electrodes have the same electric potential and the same structure, and a region surrounded with the cathode side dummy gate electrodes provides the cathode side second region, which is electrically coupled with the emitter electrode.

Alternatively, the gate electrode may include a plurality of cathode side gate electrodes, which is disposed in a part of the base layer over the cathode region. The part of the base layer is disposed within a predetermined range from an interface between the cathode region and the collector region. The gate electrode further includes a plurality of cathode side dummy gate electrodes, which is disposed in a residual part of the base layer over the cathode region. The cathode side dummy gate electrodes and the cathode side gate electrodes have the same electric potential and the same structure. The base layer is further divided by the cathode side dummy gate electrodes into a plurality of cathode side second and third regions, which are alternately arranged along with the parallel direction of the substrate. Each third region includes an dummy emitter region. Each dummy emitter region is arranged in a surface portion of the third region, contacts the dummy gate electrode, has the first conductive type, and an impurity concentration higher than the substrate; and the third region has a floating potential.

Alternatively, the gate electrode may include a plurality of cathode side gate electrodes, which is disposed in a part of the base layer over the cathode region. The part of the base layer is disposed within a predetermined range from an interface between the cathode region and the collector region. The gate electrode further includes a plurality of cathode side dummy gate electrodes, which is disposed in a residual part of the base layer over the cathode region. The cathode side dummy gate electrodes and the cathode side gate electrodes have the same structure. The base layer is further divided by the cathode side dummy gate electrodes into a plurality of cathode side second and third regions, which are alternately arranged along with the parallel direction of the substrate. Each third region includes a dummy emitter region. Each dummy emitter region is arranged in a surface portion of the third region, contacts the dummy gate electrode, has the first conductive type, and an impurity concentration higher than the substrate, and the cathode side dummy gate electrodes, the dummy emitter region and the third regions are commonly and electrically coupled with the emitter electrode.

Alternatively, each of the first regions and the cathode side second region may include a trench contact portion for contacting the emitter electrode, and each trench contact portion includes a trench disposed on the first side of the substrate and a conductive film in the trench.

Alternatively, each of the first regions and the cathode side second region may include a first semiconductor layer having the first conductive type. The first semiconductor layer is disposed between the substrate and one of the first regions and the cathode side second region, and the first semiconductor layer has an impurity concentration, which is higher than the substrate and lower than the emitter region.

Alternatively, the collector side second region having the floating potential may include the first semiconductor layer, and the first semiconductor layer is disposed between the substrate and the collector side second region.

Alternatively, each first region may include a trench contact portion for contacting the emitter electrode. Each trench contact portion includes a trench disposed on the first side of the substrate and a conductive film in the trench. Each first region includes a second semiconductor layer having the second conductive type. The second semiconductor layer is disposed between the first semiconductor layer and the trench, contact portion, and the second semiconductor layer has an impurity concentration, which is higher than the base layer.

Alternatively, the cathode side second region coupled with the emitter electrode may include the trench contact portion for contacting the emitter electrode.

Alternatively, the plurality of first and second regions may be alternately arranged along with the parallel direction of the substrate.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A semiconductor device comprising:
    a semiconductor substrate having a first conductive type and including a first side and a second side;
    an IGBT element for flowing current in a thickness direction of the substrate, wherein the IGBT element is arranged in the substrate, the IGBT includes a collector region having a second conductive type, and the collector region is arranged in a surface portion of the second side of the substrate;
    a FWD element including a cathode region having the first conductive type, wherein the cathode region is arranged in another surface portion of the second side of the substrate in such a manner that the cathode region is adjacent to the collector region along with a parallel direction of the substrate;
    a base layer having the second conductive type and arranged on the first side of the substrate;
    a plurality of trench gate structures, each of which includes a trench on the first side of the substrate and a conductive film in the trench via an insulation film,
    wherein the base layer is divided by the trench gate structures into a plurality of first and second regions,
    wherein the trench gate structures include a gate electrode in the IGBT element; wherein each first region includes an emitter region in the IGBT element,
    wherein each emitter region is arranged in a surface portion of the first region, contacts the gate electrode, has the first conductive type, and has an impurity concentration higher than the substrate,
    wherein each second region does not include the emitter region,
    wherein each first region together with the emitter region is electrically coupled with an emitter electrode in the IGBT element,
    wherein the first regions include a collector side first region and a cathode side first region,
    wherein the collector side first region is disposed over the collector region, and the cathode side first region is disposed over the cathode region, wherein the second regions include a collector side second region and a cathode side second region, wherein the collector side second region is disposed over the collector region, and the cathode side second region is disposed over the cathode region, wherein the cathode side second region is divided into a first cathode part and a second cathode part, wherein the collector side second region is divided into a first collector part and a second collector part, wherein the first cathode part of the cathode side second region is electrically coupled with the emitter electrode, wherein the second cathode part of the cathode side second region has a floating potential, wherein a number of second regions in the first cathode part of the cathode side second region is larger than a number second regions in the second cathode part of the cathode side second region, wherein the first collector part of the collector side second region has a floating potential, wherein the second collector part of the collector side second region is electrically coupled with the emitter electrode, and wherein a number of second regions in the first collector part of the collector side second region is larger than a number of second regions in the second collector part of the collector side second region.

2. The semiconductor device according to claim 1, further comprising:

a sense element for flowing current therethrough; and a feedback circuit, wherein the substrate further includes a main region and a sense region, wherein the IGBT element and the FWD element are arranged in the main region, wherein the sense region has an area, which is smaller than the main region, wherein the current flowing through the sense element is in proportion to current flowing through the FWD element, wherein the sense element is arranged in the sense region, wherein the feedback circuit determines based on a detection result of the sense element whether the FWD element is in an operation state or a non-operation state, wherein the feedback circuit blocks input of a driving signal to the gate electrode when the FWD element is in the operation state, and wherein the feedback circuit passes the input of the driving signal to the gate electrode when the FWD element is in the non-operation state.

3. The semiconductor device according to claim 2, further comprising:

a sense resistor coupled with the sense element, wherein the feedback circuit has a first threshold and a second threshold, which are used for determining whether current flows through the FWD element, wherein the first threshold corresponds to a potential difference between both ends of the sense resistor when the IGBT element is in an on-state, and current flowing through the substrate is a predetermined first current, wherein the second threshold corresponds to the potential difference between both ends of the sense resistor when the IGBT element is in an off-state, and the current flowing through the substrate is a predetermined second current, wherein the second current is larger than the first current, and the second threshold is larger than the first threshold, wherein the feedback circuit compares the potential difference between both ends of the sense resistor and the first or second threshold, wherein the feedback circuit passes the input of the driving signal to the gate electrode until the potential difference between both ends of the sense resistor falls below the first threshold, and wherein the feedback circuit blocks the input of the driving signal to the gate electrode until the potential difference between both ends of the sense resistor exceeds the second threshold.

4. The semiconductor device according to claim 1, wherein a whole part of the cathode side second region is electrically coupled with the emitter electrode, and wherein a whole part of the collector side second region has a floating potential.

5. The semiconductor device according to claim 1, wherein all of the trench gate structures provide the gate electrode in the IGBT element, wherein the gate electrode includes a plurality of cathode side gate electrodes, which is disposed in a part of the base layer over the cathode region, wherein the part of the base layer is disposed within a predetermined range from an interface between the cathode region and the collector region, and wherein a residual part of the base layer over the cathode region provides the cathode side second region, which is electrically coupled with the emitter electrode.

6. The semiconductor device according to claim 1, wherein the gate electrode includes a plurality of cathode side gate electrodes, which is disposed in a part of the base layer over the cathode region, wherein the part of the base layer is disposed within a predetermined range from an interface between the cathode region and the collector region, wherein the gate electrode further includes a plurality of cathode side dummy gate electrodes, which is disposed in a residual part of the base layer over the cathode region, wherein the cathode side dummy gate electrodes and the cathode side gate electrodes have the same electric potential and the same structure, and wherein a region surrounded with the cathode side dummy gate electrodes provides the cathode side second region, which is electrically coupled with the emitter electrode.

7. The semiconductor device according to claim 1, wherein the gate electrode includes a plurality of cathode side gate electrodes, which is disposed in a part of the base layer over the cathode region, wherein the part of the base layer is disposed within a predetermined range from an interface between the cathode region and the collector region, wherein the gate electrode further includes a plurality of cathode side dummy gate electrodes, which is disposed in a residual part of the base layer over the cathode region, wherein the cathode side dummy gate electrodes and the cathode side gate electrodes have the same electric potential and the same structure, wherein the base layer is further divided by the cathode side dummy gate electrodes into a plurality of cathode side second and third regions, which are alternately arranged along with the parallel direction of the substrate, wherein each third region includes an dummy emitter region, wherein each dummy emitter region is arranged in a surface portion of the third region, contacts the dummy gate electrode, has the first conductive type, and an impurity concentration higher than the substrate, and wherein the third region has a floating potential.

8. The semiconductor device according to claim 1, wherein the gate electrode includes a plurality of cathode side gate electrodes, which is disposed in a part of the base layer over the cathode region, wherein the part of the base layer is disposed within a predetermined range from an interface between the cathode region and the collector region, wherein the gate electrode further includes a plurality of cathode side dummy gate electrodes, which is disposed in a residual part of the base layer over the cathode region, wherein the cathode side dummy gate electrodes and the cathode side gate electrodes have the same structure, wherein the base layer is further divided by the cathode side dummy gate electrodes into a plurality of cathode side second and third regions, which are alternately arranged along with the parallel direction of the substrate, wherein each third region includes an dummy emitter region, wherein each dummy emitter region is arranged in a surface portion of the third region, contacts the dummy gate electrode, has the first conductive type, and an impurity concentration higher than the substrate, and wherein the cathode side dummy gate electrodes, the dummy emitter region and the third regions are commonly and electrically coupled with the emitter electrode.

9. The semiconductor device according to claim 1, wherein each of the first regions and the cathode side second region includes a trench contact portion for contacting the emitter electrode, and wherein each trench contact portion includes a trench disposed on the first side of the substrate and a conductive film in the trench.

10. The semiconductor device according to claim 1, wherein each of the first regions and the cathode side second region includes a first semiconductor layer having the first conductive type, wherein the first semiconductor layer is disposed between the substrate and one of the first regions and the cathode side second region, and wherein the first semiconductor layer has an impurity concentration, which is higher than the substrate and lower than the emitter region.

11. The semiconductor device according to claim 10, wherein the collector side second region having the floating potential includes the first semiconductor layer, and wherein the first semiconductor layer is disposed between the substrate and the collector side second region.

12. The semiconductor device according to claim 10, wherein each first region includes a trench contact portion for contacting the emitter electrode, wherein each trench contact portion includes a trench disposed on the first side of the substrate and a conductive film in the trench, wherein each first region includes a second semiconductor layer having the second conductive type, wherein the second semiconductor layer is disposed between the first semiconductor layer and the trench contact portion, and wherein the second semiconductor layer has an impurity concentration, which is higher than the base layer.

13. The semiconductor device according to claim 12, wherein the cathode side second region coupled with the emitter electrode includes the trench contact portion for contacting the emitter electrode.

14. The semiconductor device according to claim 1, wherein the plurality of first and second regions are alternately arranged along with the parallel direction of the substrate.

15. A semiconductor device comprising:

a semiconductor substrate having a first conductive type and including a first side and a second side;

an IGBT element configured to flow current in a thickness direction of the substrate, the IGBT element being arranged in the substrate, the IGBT including a collector region having a second conductive type, and the collector region being arranged in a first surface portion of the second side of the substrate;

a FWD element including a cathode region having the first conductive type, the cathode region being arranged in a second surface portion of the second side of the substrate in such a manner that the cathode region is adjacent to the collector region along a parallel direction of the substrate;

a base layer having the second conductive type and arranged on the first side of the substrate; and a plurality of trench gate structures formed on the first side of the substrate, each of the plurality of trench gate structures including a trench on the first side of the substrate, an insulation film lining the trench, and a conductive film formed in the trench over the insulation film, wherein the base layer is divided by the trench gate structures into a plurality of first and second regions, wherein the plurality of trench gate structures each include a gate electrode of the IGBT element, wherein each first region includes an emitter region of the IGBT element, wherein each emitter region: (1) is arranged in a surface portion of a corresponding first region, (2) contacts a corresponding gate electrode, (3) has the first conductive type, and (4) has an impurity concentration higher than the substrate, wherein each second region does not include the emitter region, wherein each first region together with the emitter region is electrically coupled with an emitter electrode in the IGBT element, wherein all of the second regions that are disposed over the collector region form a first plurality of the second regions, and all of the second regions that are disposed over the cathode region form a second plurality of the second regions, wherein the first plurality of second regions disposed over the collector region have a floating potential, wherein the second plurality of second regions disposed over the cathode region are electrically coupled with the emitter electrode.

16. The semiconductor device according to claim 15, wherein the plurality of first and second regions are alternately arranged along with the parallel direction of the substrate.

* * * * *